United States Patent
Enya et al.

(10) Patent No.: US 9,379,523 B2
(45) Date of Patent: Jun. 28, 2016

(54) GROUP III NITRIDE SEMICONDUCTOR DEVICE, P-TYPE CONTACT STRUCTURE, AND METHOD FOR FABRICATING GROUP III NITRIDE SEMICONDUCTOR DEVICE

(71) Applicants: Sumitomo Electric Industries, Ltd., Osaka-shi (JP); SONY CORPORATION, Tokyo (JP)

(72) Inventors: Yohei Enya, Itami (JP); Takashi Kyono, Itami (JP); Masaki Ueno, Itami (JP); Takao Nakamura, Itami (JP); Takashi Matsuura, Itami (JP); Tatsushi Hamaguchi, Kanagawa (JP); Yuji Furushima, Miyagi (JP)

(73) Assignees: Sumitomo Electric Industries, Ltd., Osaka-shi (JP); SONY CORPORATION, Tokyo (JP)

( * ) Notice: Subject to any disclaimer, the term of this patent is extended or adjusted under 35 U.S.C. 154(b) by 0 days.

(21) Appl. No.: 14/643,059

(22) Filed: Mar. 10, 2015

(65) Prior Publication Data
US 2015/0255958 A1 Sep. 10, 2015

(30) Foreign Application Priority Data
Mar. 10, 2014 (JP) ................................ 2014-046342

(51) Int. Cl.
| *H01S 5/343* | (2006.01) |
|---|---|
| *H01L 21/66* | (2006.01) |
| *H01L 33/00* | (2010.01) |
| *H01L 33/06* | (2010.01) |
(Continued)

(52) U.S. Cl.
CPC ............ *H01S 5/34333* (2013.01); *H01L 22/14* (2013.01); *H01L 22/20* (2013.01);
(Continued)

(58) Field of Classification Search
CPC . H01L 29/2003; H01L 29/737; H01L 29/201; H01L 29/205; H01L 29/475; H01L 29/66242; H01L 29/045; H01L 33/0025; H01L 33/06; H01L 33/12; H01L 33/36; H01L 33/0075; H01L 33/32; H01S 5/34333; H01S 5/0425
See application file for complete search history.

(56) References Cited

U.S. PATENT DOCUMENTS

| 2009/0278164 A1* | 11/2009 | Osawa | .................... H01L 24/32 257/103 |
|---|---|---|---|
| 2010/0008391 A1* | 1/2010 | Nakagawa | ............. B82Y 20/00 372/45.011 |

(Continued)

FOREIGN PATENT DOCUMENTS

| JP | 08-330629 | 12/1996 |
|---|---|---|
| JP | H11-340509 A | 12/1999 |

(Continued)

*Primary Examiner* — Allan R Wilson
(74) *Attorney, Agent, or Firm* — Venable LLP; Michael A. Sartori; F. Brock Riggs

(57) ABSTRACT

A Group III nitride semiconductor device comprises: a Group III nitride semiconductor layer having a primary surface, inclined with respect to a c-plane of the Group III nitride semiconductor at an angle in a range of 50 degrees or more and 80 degrees or less, of a Group III nitride semiconductor; a p-type Group III nitride semiconductor laminate including first to third p-type Group III nitride semiconductor layers, the first to third p-type Group III nitride semiconductor layers being provided on the primary surface of the Group III nitride semiconductor layer, the first and third p-type Group III nitride semiconductor layers sandwiching the second p-type Group III nitride semiconductor layer such that the second p-type Group III nitride semiconductor layer incorporates strain; and an electrode provided on the p-type Group III nitride semiconductor laminate. The electrode is in contact with the first p-type Group III nitride semiconductor layer.

18 Claims, 9 Drawing Sheets

(51) Int. Cl.
- *H01L 33/12* (2010.01)
- *H01L 33/32* (2010.01)
- *H01L 33/36* (2010.01)
- *H01L 29/20* (2006.01)
- *H01L 29/205* (2006.01)
- *H01L 29/66* (2006.01)
- *H01L 29/737* (2006.01)
- *H01L 21/02* (2006.01)
- *H01S 5/042* (2006.01)
- *H01S 5/32* (2006.01)
- *H01S 5/30* (2006.01)

(52) U.S. Cl.
CPC ........ *H01L33/0025* (2013.01); *H01L 33/0075* (2013.01); *H01L 33/06* (2013.01); *H01L 33/12* (2013.01); *H01L 33/32* (2013.01); *H01L 33/36* (2013.01); *H01S 5/0421* (2013.01); *H01L 21/0254* (2013.01); *H01L 21/02458* (2013.01); *H01L 21/02505* (2013.01); *H01L 29/2003* (2013.01); *H01L 29/205* (2013.01); *H01L 29/66242* (2013.01); *H01L 29/737* (2013.01); *H01L 2933/0016* (2013.01); *H01S 5/0425* (2013.01); *H01S 5/3063* (2013.01); *H01S 5/3202* (2013.01)

(56) References Cited

U.S. PATENT DOCUMENTS

| | | | |
|---|---|---|---|
| 2010/0055820 A1* | 3/2010 | Akita | B82Y 20/00 438/47 |
| 2010/0213439 A1* | 8/2010 | Ueno | B82Y 20/00 257/13 |
| 2010/0260224 A1* | 10/2010 | Yoshizumi | B82Y 20/00 372/45.01 |
| 2011/0128983 A1* | 6/2011 | Takagi | B82Y 20/00 372/45.01 |
| 2013/0009202 A1* | 1/2013 | Enya | H01L 33/32 257/103 |
| 2013/0051417 A1* | 2/2013 | Sumitomo | H01S 5/0425 372/44.011 |
| 2013/0105762 A1* | 5/2013 | Kyono | H01L 33/06 257/13 |

FOREIGN PATENT DOCUMENTS

| | | |
|---|---|---|
| JP | 2001060720 A | 3/2001 |
| JP | 2012227492 A | 11/2012 |
| WO | WO-99/46822 A1 | 9/1999 |

* cited by examiner

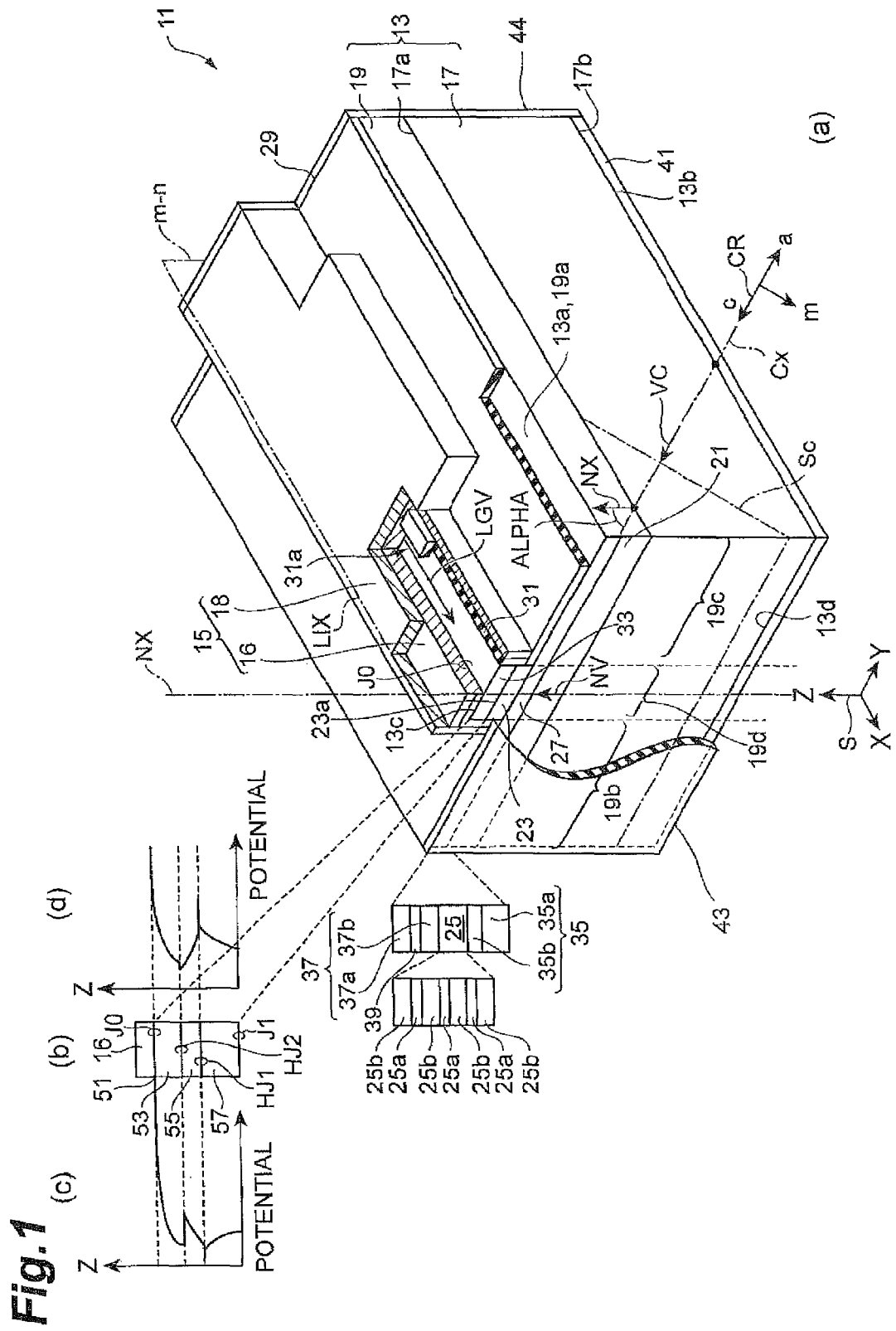

Fig.4

| | | | | |
|---|---|---|---|---|
| p+GaN | 10 | nm | Mg: | 3.0E+20 |
| p+In$_x$Al$_y$Ga$_{(1-x-y)}$N | 3 | nm | Mg: | 3.0E+20 |
| p-GaN | 40 | nm | Mg: | 3.0E+19 |
| p-Al$_{0.06}$Ga$_{0.94}$N | 400 | nm | Mg: | 5.0E+18 |
| un-In$_{0.05}$Ga$_{0.95}$N | 50 | nm | | |
| un-InGaN | 3 | nm | | |
| un-In$_{0.25}$Ga$_{0.75}$N | 3 | nm | | |
| un-InGaN | 3 | nm | | |
| n-In$_{0.05}$Ga$_{0.95}$N | 80 | nm | Si: | 5.0E+17 |
| n-GaN | 500 | nm | Si: | 2.0E+18 |
| n-Al$_{0.06}$Ga$_{0.94}$N | 1.0 | μm | Si: | 2.0E+18 |
| n-GaN | 1.1 | μm | Si: | 2.0E+18 |
| GaN Substrate | | | | |

Fig.5

| No. | x | y | ρc [Ωcm²] | Vf [V] |
|---|---|---|---|---|
| 1 | 0 | 0 | 5e-4 | 4.5 |
| 2 | 0.01 | 0 | 1e-4 | 4.2 |
| 3 | 0.04 | 0 | 1e-4 | 4.2 |
| 4 | 0.10 | 0 | 1e-3 | 4.8 |
| 5 | 0 | 0.01 | 1e-4 | 4.2 |
| 6 | 0 | 0.04 | 1e-4 | 4.2 |
| 7 | 0 | 0.10 | 1e-3 | 4.8 |
| 8 | 0.04 | 0.04 | 1e-4 | 4.2 |

GROUP III NITRIDE SEMICONDUCTOR DEVICE, P-TYPE CONTACT STRUCTURE, AND METHOD FOR FABRICATING GROUP III NITRIDE SEMICONDUCTOR DEVICE

BACKGROUND OF THE INVENTION

1. Field of the Invention

The present invention relates to a Group III nitride semiconductor device, a p-type contact structure, and a method for fabricating a Group III nitride semiconductor device.

2. Related Background Art

Japanese Patent Application Publication No. H08-330629 discloses a nitride semiconductor light emitting device with a good luminous efficacy. The nitride semiconductor light emitting device includes an n-type nitride semiconductor layer, a p-type nitride semiconductor layer, and an active layer for emission between the n-type nitride semiconductor layer and the p-type nitride semiconductor layer.

SUMMARY OF THE INVENTION

A positive electrode is formed on the surface of the p-type nitride semiconductor layer in the nitride semiconductor light emitting device. In the nitride semiconductor light emitting device, the p-type nitride semiconductor region includes a first p-type nitride semiconductor layer and a second p-type nitride semiconductor layer. The first p-type nitride semiconductor layer has a high acceptor concentration and is in contact with the positive electrode. The second p-type nitride semiconductor layer has an acceptor concentration lower than the first p-type nitride semiconductor layer and is in contact with the first p-type nitride semiconductor layer. In terms of the interface in contact with the positive electrode, the first p-type nitride semiconductor layer with a high impurity concentration provides the surface that is in contact with the above positive electrode, and the second p-type nitride semiconductor layer with a low impurity concentration is provided in contact with the first p-type nitride semiconductor layer. These p-conductivity layers are provided with a dopant profile formed by adjusting an acceptor concentration thereof with reference to the layer in contact with the positive electrode, thereby improving luminous efficacy of the nitride semiconductor light emitting device.

As described above in Japanese Patent Application Publication No. H08-330629, the performance of the nitride semiconductor light emitting device is improved by use of the adjusted shape of a dopant profile in the p-type nitride semiconductor region that is in contact with the positive electrode. However, the present inventors have found that a further improvement is required in the luminous enhancement in the nitride semiconductor light emitting device, and, specifically, have focused on the improvement in the physical contact between the p-type nitride semiconductor region and the electrode in the nitride semiconductor device, such as a light emitting device or an electronic device.

One aspect of the present invention is to provide a nitride semiconductor device having a structure capable of improving features of a physical contact between a p-type nitride semiconductor region and an electrode. Another aspect of the present invention is to provide a p-type contact structure capable of improving features of a physical contact between a p-type nitride semiconductor region and an electrode. Yet another aspect of the present invention is to provide a method for fabricating a nitride semiconductor light emitting device with a structure that is capable of improving features of a physical contact between a p-type nitride semiconductor region and an electrode.

One aspect of the present invention relates to a Group III nitride semiconductor device. The Group III nitride semiconductor device comprises: a Group III nitride semiconductor layer having a primary surface including a Group III nitride semiconductor, the primary surface being inclined with respect to a c-plane of the Group III nitride semiconductor at an angle in a range of 50 degrees or more and 80 degrees or less; a p-type Group III nitride semiconductor laminate including a first p-type Group III nitride semiconductor layer, a second p-type Group III nitride semiconductor layer and a third p-type Group III nitride semiconductor layer, the first p-type Group III nitride semiconductor layer, the second p-type Group III nitride semiconductor layer and the third p-type Group III nitride semiconductor layer being provided on the primary surface of the Group III nitride semiconductor layer, the second p-type Group III nitride semiconductor layer being sandwiched between the first p-type Group III nitride semiconductor layer and the third p-type Group III nitride semiconductor layer such that the second p-type Group III nitride semiconductor layer incorporates strain; and an electrode provided on the p-type Group III nitride semiconductor laminate, the electrode being in contact with the first p-type Group III nitride semiconductor layer, and the first p-type Group III nitride semiconductor layer, the second p-type Group III nitride semiconductor layer, and the third p-type Group III nitride semiconductor layer being arranged in a direction from the electrode to the Group III nitride semiconductor layer along an axis normal to the primary surface.

Another aspect of the present invention relates to a p-type contact structure. The p-type contact structure comprises: a Group III nitride semiconductor layer having a primary surface, the primary surface including a Group III nitride semiconductor and being inclined with respect to a c-plane of the Group III nitride semiconductor at an angle in a range of 50 degrees or more and 80 degrees or less; a p-type Group III nitride semiconductor region provided on the primary surface of the Group III nitride semiconductor layer; and an electrode provided on the p-type Group III nitride semiconductor region, the p-type Group III nitride semiconductor region including a first p-type Group III nitride semiconductor layer, a second p-type Group III nitride semiconductor layer and a third p-type Group III nitride semiconductor, the first p-type Group III nitride semiconductor layer, the second p-type Group III nitride semiconductor layer, and the third p-type Group III nitride semiconductor layer being arranged in a direction from the electrode to the Group III nitride semiconductor layer along an axis normal to the primary surface, the electrode being in contact with the first p-type Group III nitride semiconductor layer, and the first p-type Group III nitride semiconductor layer forming a first heterojunction with the second p-type Group III nitride semiconductor layer, the second p-type Group III nitride semiconductor layer forming a second heterojunction with the third p-type Group III nitride semiconductor layer, and the second p-type Group III nitride semiconductor layer incorporating strain.

Yet another aspect of the present invention relates to a method for fabricating a Group III nitride semiconductor device. The method comprises the steps of preparing plural substrates, each having a primary surface including a Group III nitride semiconductor; forming plural epitaxial substrates each including a p-type nitride semiconductor laminate, the p-type nitride semiconductor laminate including a first p-type Group III nitride semiconductor layer, a second p-type Group III nitride semiconductor layer, and a third p-type Group III nitride semiconductor layer, the second p-type Group III nitride semiconductor layer containing a first Group III element and a second Group III element; forming an electrode in contact with a surface of the p-type nitride semiconductor laminate in each epitaxial substrate, respectively, to form plural substrate products; measuring contact resistance between the surface of the p-type semiconductor laminate and the electrode in each substrate product; obtaining a relationship between the contact resistance in each substrate product and a ratio between the first Group III element and the second III element in each substrate product; determining a composition ratio between the first Group III element and the second Group III element of the second p-type Group III nitride semiconductor layer by use of the relationship; growing, in order, a third Group III nitride layer, a second Group III nitride layer, and a first Group III nitride layer to form a Group III nitride semiconductor device, the second Group III nitride layer having the composition ratio thus determined; and forming an electrode in contact with a surface of the first Group III nitride layer in order to fabricate the Group III nitride semiconductor device, the step of forming plural epitaxial substrates comprising growing the third p-type Group III nitride semiconductor layer, the second p-type Group III nitride semiconductor layer, and the first p-type Group III nitride semiconductor layer in order on the primary surface in each of the substrates, the second p-type Group III nitride semiconductor layer being sandwiched by the first p-type Group III nitride semiconductor layer and the third p-type Group III nitride semiconductor layer to include strain, and in the step of forming plural epitaxial substrates, the second p-type Group III nitride semiconductor layer in each epitaxial substrate being grown such that the ratio in any of the epitaxial substrates is different than the others of the epitaxial substrates.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 1 is a schematic view showing the structure of a Group III nitride semiconductor device according to an embodiment of the present invention;

FIG. 4 is a drawing showing a structure in Example 1 according to the embodiment;

FIG. 5 is a view showing a table of experimental conditions for Example 1;

DESCRIPTION OF THE PREFERRED EMBODIMENTS

Figure 2A:
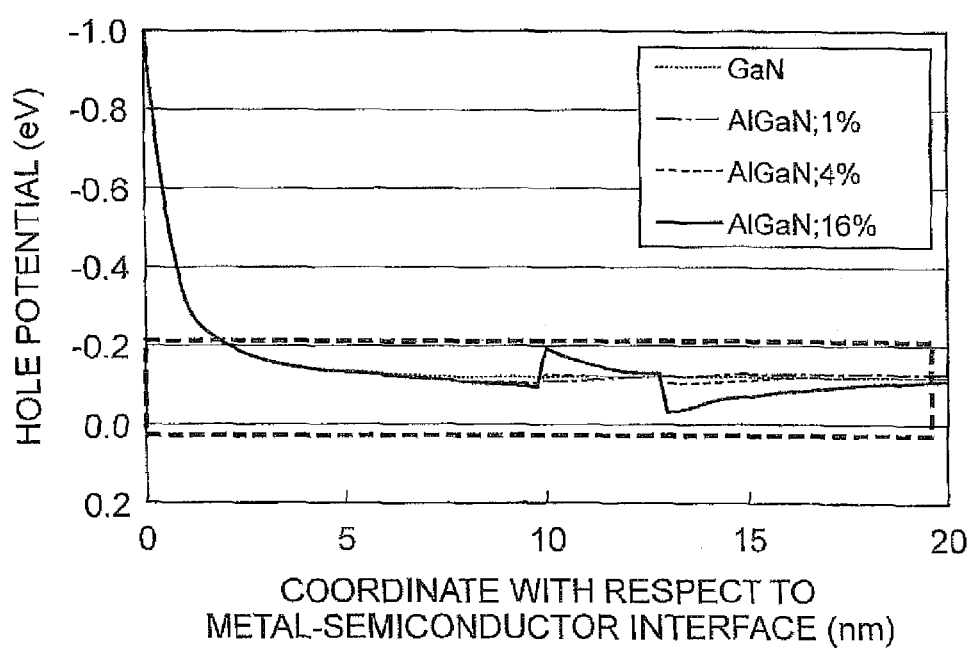
FIG. 2A is a view showing calculated values of a potential diagram.

Some specific embodiments according to the present above aspects are described below.

One embodiment according to the above aspect relates to a Group III nitride semiconductor device. The Group III nitride semiconductor device comprises: a Group III nitride semiconductor layer having a primary surface including a Group III nitride semiconductor, the primary surface being inclined with respect to a c-plane of the Group III nitride semiconductor at an angle in a range of 50 degrees or more and 80 degrees or less; a p-type Group III nitride semiconductor laminate including a first p-type Group III nitride semiconductor layer, a second p-type Group III nitride semiconductor layer, and a third p-type Group III nitride semiconductor layer, the first p-type Group III nitride semiconductor layer, the second p-type Group III nitride semiconductor layer and the third p-type Group III nitride semiconductor layer being provided on the primary surface of the Group III nitride semiconductor layer, the second p-type Group III nitride semiconductor layer being sandwiched between the first p-type Group III nitride semiconductor layer and the third p-type Group III nitride semiconductor layer such that the second p-type Group III nitride semiconductor layer incorporates strain; and an electrode provided on the p-type Group III nitride semiconductor laminate, the electrode being in contact with the first p-type Group III nitride semiconductor layer, and the first p-type Group III nitride semiconductor layer, the second p-type Group III nitride semiconductor layer, and the third p-type Group III nitride semiconductor layer being arranged in a direction from the electrode to the Group III nitride semiconductor layer along an axis normal to the primary surface.

According to the Group III nitride semiconductor device, an interface barrier is formed at the metal-semiconductor interface at which the electrode and the first p-type Group III nitride semiconductor layer form a physical contact, and the interface barrier appears as a contact resistance of the Group III nitride semiconductor device. The p-type Group III nitride semiconductor laminate is configured such that the second p-type Group III nitride semiconductor layer is sandwiched by the first p-type Group III nitride semiconductor layer and the third p-type Group III nitride semiconductor layer, thereby making the second p-type Group III nitride semiconductor layer strained. In this p-type Group III nitride semiconductor laminate, the band structure of the p-type Group III nitride semiconductor laminate changes due to the second p-type Group III nitride semiconductor layer thus strained. This change in the band structure works to reduce the barrier height of the interface barrier located at the metal-semiconductor interface when the primary surface of a base on which the p-type Group III nitride semiconductor layers is formed is inclined at an angle in the range of 50 degrees or more and less than 80 degrees. Thus, it is effective in reduction of the contact resistance of the Group III nitride semiconductor device.

In the Group III nitride semiconductor device according to the present embodiment, the second p-type Group III nitride semiconductor layer has an acceptor concentration ranging from −20% to +20% of an acceptor concentration of the first p-type Group III nitride semiconductor layer, and the third p-type Group III nitride semiconductor layer has an acceptor concentration lower than the first p-type Group III nitride semiconductor layer and the second p-type Group III nitride semiconductor layer.

According to this Group III nitride semiconductor device, the third p-type Group III nitride semiconductor layer has an acceptor concentration lower than the first p-type Group III nitride semiconductor layer and the second p-type Group III nitride semiconductor layer, thereby avoiding a reduction in crystal qualities of the first p-type Group III nitride semiconductor layer and the second p-type Group III nitride semiconductor layer, which are grown on the third p-type Group III nitride semiconductor layer. Moreover, the second p-type Group III nitride semiconductor layer has an acceptor concentration in the range of −20% or more and +20% or less with respect to an acceptor concentration in the first p-type Group III nitride semiconductor layer, thereby reducing an influence of a barrier in the second p-type Group III nitride semiconductor layer.

In the Group III nitride semiconductor device according to the present embodiment, the first p-type Group III nitride semiconductor layer is different in constituent from the second p-type Group III nitride semiconductor layer, the third p-type Group III nitride semiconductor layer is different in constituent from the second p-type Group III nitride semiconductor layer, and a Group III nitride semiconductor of the second p-type Group III nitride semiconductor layer contains at least one of indium (In) and aluminum (Al) as a constituent element.

According to this Group III nitride semiconductor device, when the Group III nitride semiconductor of the second Group III nitride semiconductor layer contains at least one of indium (In) and aluminum (Al) as a constituent element (s), the second Group III nitride semiconductor layer can be provided easily with strain.

In the Group III nitride semiconductor device according to the present embodiment, the second p-type Group III nitride semiconductor layer can have a thickness ranging from 2 nm to 10 nm.

According to this Group III nitride semiconductor device, the strain of the second p-type Group III nitride semiconductor layer works to reduce the interface barrier at the metal-semiconductor interface between the first p-type Group III nitride semiconductor layer and the electrode but to form a band barrier in the second p-type Group III nitride semiconductor layer. The above-described thickness range can reduce the manifestation of an influence of the band barrier in the second p-type Group ITT nitride semiconductor layer.

In the Group III nitride semiconductor device according to the present embodiment, the acceptor can include Mg and/or Zn. In this Group III nitride semiconductor device, Mg and Zn are used as a dopant for p-type conductivity.

In the Group III nitride semiconductor device according to the present embodiment, the primary surface of the Group III nitride semiconductor layer may be inclined with respect to the c-plane of the Group III nitride semiconductor at an angle in the range of 63 degrees or more and less than 80 degrees.

In the Group III nitride semiconductor device according to the present embodiment, the material of the third p-type Group III nitride semiconductor layer can be the same as the material of the first p-type Group III nitride semiconductor layer. According to this Group III nitride semiconductor device, the first p-type Group III nitride semiconductor layer and the third p-type Group III nitride semiconductor layer which are made of the same material allows the second Group III nitride semiconductor layer to be easily strained therein.

In the Group III nitride semiconductor device according to the present embodiment, the first p-type Group III nitride semiconductor layer can comprise GaN. According to this Group III nitride semiconductor device, the first p-type Group III nitride semiconductor layer and the third p-type Group III nitride semiconductor layer which are both formed of GaN allows the second Group III nitride semiconductor layer to be easily strained.

In the Group III nitride semiconductor device according to the present embodiment, the second p-type Group III nitride semiconductor layer can comprise AlGaN. According to this Group III nitride semiconductor device, the AlGaN of the second p-type Group III nitride semiconductor layer allows the second p-type Group III nitride semiconductor layer to involve tensile strain.

In the Group III nitride semiconductor device according to the present embodiment, the AlGaN of the second p-type Group III nitride semiconductor layer may have an Al composition equal to 2% or more, and may have an Al composition equal to 10% or less. According to this Group III nitride semiconductor device, the AlGaN with a Al composition in the above-described range can function so as to provide a reducing action, which is caused by the strain of the second p-type Group III nitride semiconductor layer, of reducing the height of the interface bather located at the metal-semiconductor interface, and can reduce the appearance of an influence of the band barrier arising from the AlGaN itself.

In the Group III nitride semiconductor device according to the present embodiment, the second p-type Group III nitride semiconductor layer can comprises InGaN. According to this Group III nitride semiconductor device, the InGaN of the second p-type Group III nitride semiconductor layer allows the second p-type Group III nitride semiconductor layer to involve compressive strain.

In the Group III nitride semiconductor device according to the present embodiment, the InGaN of the second p-type Group III nitride semiconductor layer may have an In composition of 2% or more and 10% or less. According to this Group III nitride semiconductor device, the InGaN with an In composition within the above-described range can function to provide a reducing action, which is caused by the strain of the second p-type Group III nitride semiconductor layer, of reducing the interface barrier located at the metal-semiconductor interface and can reduce the appearance of an influence of the band barrier of the InGaN itself.

In the Group III nitride semiconductor device according to the present embodiment, the first p-type Group III nitride semiconductor layer can have a thickness of 50 nm or less. According to this Group III nitride semiconductor device, the first p-type Group III nitride semiconductor layer with a thickness fallen within the above-described range allows an action of the piezo electric polarization, which is formed at the heterojunction between the first p-type Group III nitride semiconductor layer and the second p-type Group III nitride semiconductor layer, to reach the metal-semiconductor interface.

In the Group III nitride semiconductor device according to the present embodiment, the first p-type Group III nitride semiconductor layer may have an acceptor concentration of $1 \times 10^{20}$ cm$^{-3}$ or more, and the second p-type Group III nitride semiconductor layer may have an acceptor concentration of $1 \times 10^{20}$ cm$^{-3}$ or more. According to this Group III nitride semiconductor device, when the first p-type Group III nitride semiconductor layer has an acceptor concentration of $1 \times 10^{20}$ cm$^{-3}$ or more, such a high acceptor concentration can reduce a barrier at the metal-semiconductor interface.

In the Group III nitride semiconductor device according to the present embodiment, the third p-type Group III nitride semiconductor layer may have an acceptor impurity concentration of $1\times10^{19}$ cm$^{-3}$ or more and less than $5\times10^{19}$ cm$^{-3}$. According to this Group III nitride semiconductor device, the third p-type Group III nitride semiconductor layer with an acceptor concentration of $1\times10^{19}$cm$^{-3}$ or more can prevent the third p-type Group III nitride semiconductor layer from having a large specific resistance. Moreover, the first p-type Group III nitride semiconductor layer with an acceptor concentration of less than $5\times10^{19}$ cm$^{-3}$ can avoid a reduction in crystal quality, caused by the action of the high acceptor concentration.

The Group III nitride semiconductor device according to the present embodiment can further include an active layer for a light emitting device. The Group III nitride semiconductor layer may include an n-type semiconductor layer, and the active layer may be provided between the primary surface of the Group III nitride semiconductor layer and the p-type Group III nitride semiconductor region. This Group III nitride semiconductor device can provide the Group III nitride semiconductor light emitting device with the reduced barrier at the metal-semiconductor interface.

Alternatively, the Group III nitride semiconductor device according to the present embodiment can include an electronic device. This Group III nitride semiconductor device can provide the electronic device using the Group III nitride semiconductor with the reduced barrier at the metal-semiconductor interface.

Another embodiment relates to a p-type contact structure. The p-type contact structure comprises: a Group III nitride semiconductor layer having a primary surface, the primary surface including a Group III nitride semiconductor and being inclined with respect to a c-plane of the Group III nitride semiconductor at an angle in a range of 50 degrees or more and 80 degrees or less; a p-type Group III nitride semiconductor region provided on the primary surface of the Group III nitride semiconductor layer; and an electrode provided on the p-type Group III nitride semiconductor region, the p-type Group III nitride semiconductor region including a first p-type Group III nitride semiconductor layer, a second p-type Group III nitride semiconductor layer and a third p-type Group III nitride semiconductor, the first p-type Group III nitride semiconductor layer, the second p-type Group III nitride semiconductor layer, and the third p-type Group III nitride semiconductor layer being arranged in a direction from the electrode to the Group III nitride semiconductor layer along an axis normal to the primary surface, the electrode being in contact with the first p-type Group III nitride semiconductor layer, and the first p-type Group ITT nitride semiconductor layer forming a first heterojunction with the second p-type Group III nitride semiconductor layer, the second p-type Group III nitride semiconductor layer forming a second heterojunction with the third p-type Group III nitride semiconductor layer, and the second p-type Group III nitride semiconductor layer incorporating strain.

According to this p-type contact structure, an interface barrier is formed at a metal-semiconductor interface at which the electrode and the first p-type Group III nitride semiconductor layer are in contact with each other, and this interface barrier increases the contact resistance of the Group III nitride semiconductor device. The first p-type Group III nitride semiconductor layer forms a first heterojunction with the second p-type Group III nitride semiconductor layer, resulting in that this second p-type Group III nitride semiconductor layer is strained. The strained second p-type Group III nitride semiconductor layer changes a band of the first p-type Group III nitride semiconductor layer through the first heterojunction. This band change acts to reduce the height of the interface barrier at the metal-semiconductor interface when the primary surface of the base for the p-type Group III nitride semiconductor layer is tilted at an angle ranging from 50 degrees to 80 degrees. This structure is effective in the reduction in the contact resistance of the Group III nitride semiconductor device.

Yet another embodiment relates to a method for producing a Group III nitride semiconductor device. The method comprises the steps of: preparing plural substrates, each having a primary surface including a Group III nitride semiconductor; forming plural epitaxial substrates each including a p-type nitride semiconductor laminate, the p-type nitride semiconductor laminate including a first p-type Group III nitride semiconductor layer, a second p-type Group III nitride semiconductor layer, and a third p-type Group III nitride semiconductor layer, the second p-type Group III nitride semiconductor layer containing a first Group III element and a second Group III element; forming an electrode in contact with a surface of the p-type nitride semiconductor laminate in each epitaxial substrate to form plural substrate products; measuring contact resistance between the surface of the p-type semiconductor laminate and the electrode in each substrate product; obtaining a relationship between the contact resistance in each substrate product and a ratio between the first Group III element and the second Group III element in each substrate product; determining a composition ratio between the first Group III element and the second Group III element of the second p-type Group III nitride semiconductor layer by use of the relationship; growing, in order, a third Group III nitride layer, a second Group III nitride layer, and a first Group III nitride layer for a Group III nitride semiconductor device, the second Group III nitride layer having the composition ratio thus determined; and forming an electrode in contact with a surface of the first Group III nitride layer in order to fabricate the Group III nitride semiconductor device, the step of forming plural epitaxial substrates comprising growing the third p-type Group III nitride semiconductor layer, the second p-type Group III nitride semiconductor layer, and the first p-type Group III nitride semiconductor layer in order on the primary surface in each of the substrates, the second p-type Group III nitride semiconductor layer being sandwiched by the first p-type Group III nitride semiconductor layer and the third p-type Group III nitride semiconductor layer to include strain, and in the step of forming plural epitaxial substrates, the second p-type Group III nitride semiconductor layer in each of the epitaxial substrates being grown such that the ratio in any of the epitaxial substrates is different than the others of the epitaxial substrates.

According to this method for fabricating a Group III nitride semiconductor device (hereinafter referred to as the "the fabrication method"), in the fabrication of epitaxial substrates, a second p-type Group III nitride semiconductor layer for each epitaxial substrate is grown on each substrate such that a ratio between the first and second Group III elements of the second p-type Group III nitride semiconductor layer in one of the epitaxial substrates is different than those in the other epitaxial substrates, and contact resistance between the surface of the p-type semiconductor laminate and the electrode for each substrate product including the second p-type Group III nitride semiconductor layer thus formed is measured. The composition of the first and second Group III constituent elements in the second p-type Group III nitride semiconductor layer is determined on the basis of the relationship between the contact resistances of the respective substrate products and the above ratios. Thereafter, in order to produce a Group III nitride semiconductor device, the following layers are grown in this order: a third Group III nitride layer having substantially the same composition as the third p-type Group III nitride semiconductor layer; a second Group III nitride layer having the determined composition; and a first Group III nitride layer having substantially the same composition as the first p-type Group III nitride semiconductor layer. Then, in order to produce a Group III nitride semiconductor device, an electrode is formed to be in contact with the surface of the first Group ITT nitride layer. The above steps can provide a Group III nitride semiconductor device in which a forward voltage is reduced by the action of the piezoelectric polarization therein.

In the fabrication method according to the yet another embodiment, the first Group III element can be indium. Moreover, in the fabrication method according to the present embodiment, the second Group III element can be aluminum.

In the fabricating method according to the yet another embodiment, the first Group III nitride layer can include a gallium nitride based semiconductor; the second Group III nitride layer can include a gallium nitride based semiconductor; and the third Group III nitride layer can include a gallium nitride based semiconductor.

The embodiments of a Group III nitride semiconductor device, a p-type contact structure, and a method for producing a Group III nitride semiconductor device according to the present invention are described below with reference to the drawings. The identical parts are denoted by the identical reference numerals, if possible. In the description of the embodiments, a Group III nitride semiconductor laser device is described as an example of the Group III nitride semiconductor device. However, the Group III nitride semiconductor device encompasses a Group III nitride light-emitting diode and a Group III nitride electronic device. Moreover, a method for fabricating a Group III nitride semiconductor laser is described as the method for fabricating a Group III nitride semiconductor device. The p-type contact structure is applicable to the Group III nitride semiconductor laser. A method for fabricating the p-type contact structure is applicable to the method for producing a Group III nitride semiconductor laser.

FIG. 1 is a drawing schematically showing a structure of the Group III nitride semiconductor device according to an embodiment of the present invention. In the present embodiment, with reference to referring to part (a) of FIG. 1, a Group III nitride semiconductor laser device 11 will be described as the Group III nitride semiconductor device. The Group III nitride semiconductor laser device 11 has a ridge structure, but the embodiment of the present invention is not limited to the ridge structure, and it can be applied also to, for example, a gain waveguide structure. The Group III nitride semiconductor laser device 11 includes a laser structure 13 and an electrode 15. The laser structure 13 includes a support base 17 and a semiconductor region 19. The support base 17 can be formed of a hexagonal crystal Group III nitride semiconductor and has a semipolar primary surface 17a and a rear surface 17b. The semiconductor region 19 is provided on the semipolar primary surface 17a of the support base 17. The electrode 15 is provided on the semiconductor region 19 of the laser structure 13. The semiconductor region 19 includes a first cladding layer 21, a second cladding layer 23, and an active layer 25. The first cladding layer 21 is formed of a gallium nitride based semiconductor of the first conductivity type and is made of, for example, n-type AlGaN, n-type InAlGaN, or the like. The second cladding layer 23 is formed of a gallium nitride based semiconductor of the second conductivity type and is made of, for example, p-type AlGaN, p-type InAlGaN, or the like. The active layer 25 is provided between the first cladding layer 21 and the second cladding layer 23. The active layer 25 includes one or more gallium nitride based semiconductor layers, and the gallium nitride based semiconductor layers comprise, for example, well layers 25a. The active layer 25 includes barrier layers 25b formed of a gallium nitride based semiconductor, and the well layers 25a and the barrier layers 25b are alternatively arranged. The well layers 25a are formed of, for example, InGaN or the like and the barrier layers 25b are formed of, for example, GaN, InGaN, or the like. The active layer 25 can include a light emission region provided so as to emit light of a wavelength ranging from 360 nm to 600 nm, for example. The first cladding layer 21, the second cladding layer 23, and the active layer 25 are arranged along the axis NX normal to the semipolar primary surface 17a. The laser structure 13 includes a first fractured face 27 and a second fractured face 29 which work as the end surfaces for an optical cavity. The c-axis of the hexagonal crystal Group III nitride semiconductor in the support base 17 is inclined away from with respect to the normal axis NX of the semipolar primary surface 17a at an angle ALPHA, which is higher than zero.

In the laser diode structure, the following forms are applicable in view of enabling the production of end faces for the optical cavity. In an example of the laser diode structure, the c-axis of the hexagonal crystal Group III nitride semiconductor in the support base 17 can be tilted toward the axis of the waveguide extending in the direction from the first fractured face 27 to the second fractured face 29. Alternatively, in another example of the laser diode structure, the c-axis of the hexagonal crystal Group III nitride semiconductor in the support base 17 can be tilted toward the axis that intersects with (for example, orthogonal to) the direction of the axis of the waveguide extending in the direction from the first fractured face 27 to the second fractured face 29.

In the light-emitting diode structure, the following forms are applicable in view of enabling the production of a semiconductor chip. In an example of the light emitting diode structure, the c-axis of the hexagonal crystal Group III nitride semiconductor in the support base 17 can be tilted toward the axis of the waveguide that extends in the direction of the m-axis of the hexagonal crystal Group III nitride semiconductor. Alternatively, in another example of the light emitting diode structure, the c-axis of the hexagonal crystal Group III nitride semiconductor in the support base 17 can be tilted toward the a-axis of the hexagonal crystal Group III nitride semiconductor.

The Group III nitride semiconductor laser device 11 further includes an insulating film 31. The insulating film 31 covers the surface 19a of the semiconductor region 19 (surface of semiconductor region) in the laser structure 13, and the semiconductor region 19 is located between the insulating film 31 and the support base 17. For example, the first fractured face 27 and the second fractured face 29 of the laser structure 13 intersects with the m-n plane (or a-n plane) defined by the m-axis (or the a-axis) and the normal axis NX of the hexagonal Group III nitride semiconductor crystal. The support base 17 is made of a hexagonal Group III nitride semiconductor crystal. The insulating film 31 has an opening 31a (an opening of insulating film), and the opening 31a extends in the direction of an intersection LIX of the surface 19a of the semiconductor region 19 with the m-n plane (a-n plane), and has, for example, a stripe shape. The electrode 15 is in contact with the surface 19a (for example, a second conductivity type contact layer 33) of the semiconductor region 19 via the opening 31a, and extends in the direction of the line of intersection LIX. In the Group III nitride semiconductor laser device 11, the laser waveguide includes the first cladding layer 21, the second cladding layer 23 and the active layer 25, and extends in the direction in which the intersection line LIX extends.

In the present embodiment, with reference to part (b) of FIG. 1, the contact layer 33 includes a p-type Group III nitride semiconductor laminate 51. The p-type Group III nitride semiconductor laminate 51 is provided so as to be in contact with the Group III nitride semiconductor layer as the base (in the present embodiment, the second cladding layer 23). The c-axis of the hexagonal crystal Group III nitride semiconductor in the Group III nitride semiconductor layer, which works as a base, is tilted at an angle ALPHA with respect to the normal axis (the same as the normal axis NX in the present embodiment) of the semipolar primary surface in the Group III nitride semiconductor layer. In the present embodiment, the primary surface of the Group III nitride semiconductor layer (in the present example, the second cladding layer 23) is tilted with respect to the c-plane of the Group III nitride semiconductor at an angle in the range of 50 degrees to 80 degrees. The p-type Group III nitride semiconductor laminate 51 is provided on the primary surface 23a of the second cladding layer 23, and the second cladding layer 23 has a thickness of 150 nm or more. In the p-type Group III nitride semiconductor laminate 51, the second p-type Group III nitride semiconductor layer 55 is sandwiched between the first p-type Group III nitride semiconductor layer 53 and the third p-type Group III nitride semiconductor layer 57 to incorporate strain. The electrode 16 is provided on the p-type Group III nitride semiconductor laminate 51 and is in contact with the primary surface 51a of the p-type Group III nitride semiconductor laminate 51. In the p-type Group III nitride semiconductor laminate 51, the electrode 16 is in contact with the first p-type Group III nitride semiconductor layer 53. The first p-type Group III nitride semiconductor layer 53, the second p-type Group III nitride semiconductor layer 55, and the third p-type Group III nitride semiconductor layer 57 are arranged in the direction from the electrode 16 to the second cladding layer 23 along the axis normal to the primary surface 23a.

According to this Group III nitride semiconductor laser device 11, an interface balder is created at a metal-semiconductor interface J0 formed by the contact between the electrode 16 and the first p-type Group III nitride semiconductor layer 53, and this interface barrier is reflected in the contact resistance of the Group III nitride semiconductor laser device 11. The p-type Group III nitride semiconductor laminate 51 is configured such that the first p-type Group III nitride semiconductor layer 53 and the third p-type Group III nitride semiconductor layer 57 sandwich the second p-type Group III nitride semiconductor layer 55 to form the strained second p-type Group III nitride semiconductor layer 55. In this p-type Group III nitride semiconductor laminate 51, with reference to parts (c) and (d) of FIG. 1, the strain in the second p-type Group III nitride semiconductor layer 55 changes a band structure of the p-type Group III nitride semiconductor laminate 51. In parts (c) and (d) of FIG. 1, the vertical axis indicates the potential, and the horizontal axis indicates the coordinate on the Z-axis. This band structure thus changed works to reduce the height of the interface barrier at the metal-semiconductor interface formed on the primary surface 23a, which acts as the base for the p-type Group III nitride semiconductor laminate 51, inclined at an angle in the range of 50 degrees or more and less than 80 degrees. Therefore, this is effective in reducing the constant resistance of the Group III nitride semiconductor laser device 11. The structure in which the direction of the piezoelectric field can be made negative provides the effect of improving the contact resistance.

The p-type contact structure is exemplarily described below:
Layer name: Material, Dopant concentration Na.
First p-type Group III nitride semiconductor layer 53: GaN, Na=4E+20.
Second p-type Group III nitride semiconductor layer 55: $Al_xGa_{1-x}N$, Na=4E+20.
Third p-type Group III nitride semiconductor layer 57: GaN, Na=4E+19.
Electrode 16: Pd.

Such a contact structure has a thickness of, for example, 20 nm or more, and a thickness of, for example, for example, 200 nm or less. This p-type contact structure forms a junction with the primary surface of the Group III nitride semiconductor layer acting as a base, and the primary surface is tilted with respect to the c-plane of the Group III nitride semiconductor layer at an angle in the range of not less than 50 degrees and not more than 80 degrees. For example, the first p-type Group III nitride semiconductor layer 53 has a thickness of 10 nm; the second p-type Group III nitride semiconductor layer 55 has a thickness of 3 nm; and the third p-type Group III nitride semiconductor layer 57 has a thickness of 100 nm.

Figure 2B:
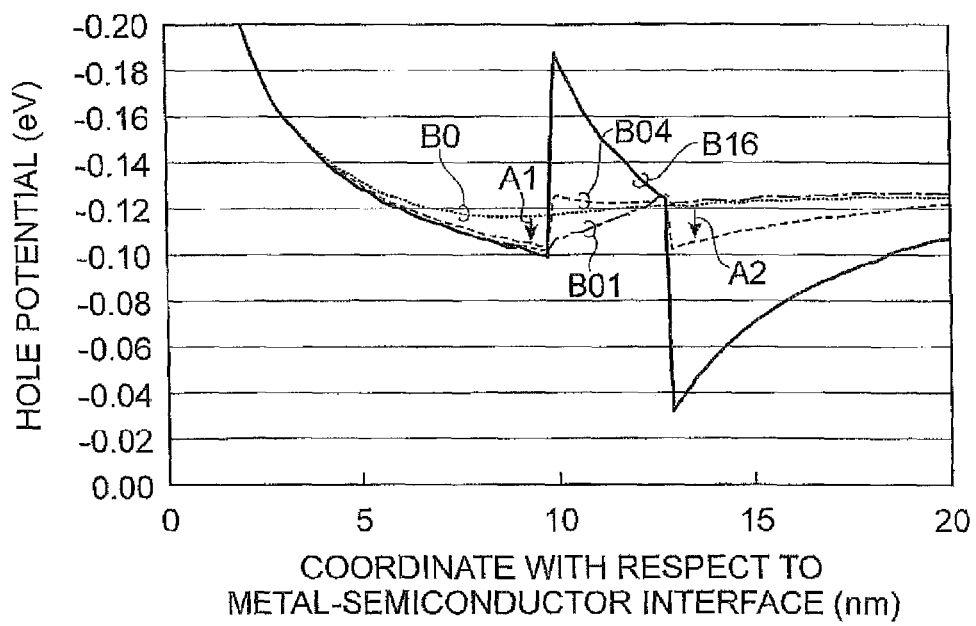
FIG. 2B is a view showing calculated values of a potential diagram.

FIGS. 2A and 2B show drawings each illustrating a potential diagram of the p-type contact structure in which a second p-type Group III nitride semiconductor layer 55 involves tensile strain. FIGS. 2A and 2B show exemplary results obtained by calculations using a model for the p-type contact structure formed on the (20-21) plane in orientation. The piezoelectric field in the second p-type Group III nitride semiconductor layer 55 is oriented in the direction from the first p-type Group III nitride semiconductor layer 53 to the third p-type Group III nitride semiconductor layer 57. FIG. 2B shows potential lines B00, B01, B04, and B16 obtained by calculations with Al composition X of 0, 0.01, 0.04, and 0.16, respectively.

FIG. 2A is a diagram showing potential lines obtained by the calculations, and FIG. 2B is an view enlarged in a range of 0 to −0.2 eV in the vertical axis of FIG. 2A to show the differences of hole potential lines BOO, B01, B04, and B16 in the vicinity of the two heterojunctions in detail. Referring to FIG. 2B, in the structure in which an AlGaN layer is provided between two gallium nitride based semiconductor layers, bands indicated by arrows A1 and A2 are lowered by the piezoelectric field in the AlGaN layer. This lowering causes the potential barrier at the metal-semiconductor interface to become thin in thickness, which allows the carrier to easily tunnel the interface barrier. This is useful in reduction of the contact resistance.

AlGaN with Al composition exceeding 10% (X=0.1) can provide a large action of lowering the band (i.e., characteristics of a physical contact between a metal and a semiconductor). On the other hand, a potential of an AlGaN layer itself may work as a barrier, and as a result, the AlGaN layer may make the total contact resistance exhibiting an electrical property of the device large. The AlGaN layer with a large thickness makes it difficult that carriers pass therethrough by tunneling. As a result, the total contact resistance across the device, which exhibits an electrical property thereof, can be increased.

The p-type contact structure is exemplarily described.
Layer name: Material, Dopant concentration Na.
First p-type Group III nitride semiconductor layer 53: GaN, Na=4E+20.
Second p-type Group III nitride semiconductor layer 55: $In_yGa_{1-y}N$, Na=4E+20.
Third p-type Group III nitride semiconductor layer 57: GaN, Na=4E+19.

Electrode 16: Pd.

Such a contact structure has a thickness of, for example, 20 nm or more, and has a thickness of, for example, 200 nm or less. This p-type contact structure forms a junction with the primary surface of the Group III nitride semiconductor layer acting as a base, and the primary surface thereof is inclined with respect to the c-plane of the Group III nitride semiconductor layer at an angle in the range of 50 degrees or more and 80 degrees or less. The first p-type Group III nitride semiconductor layer 53 has a thickness of 10 nm; the second p-type Group III nitride semiconductor layer 55 has a thickness of 3 nm; and the third p-type Group III nitride semiconductor layer 57 has a thickness of 100 nm.

Figure 3:
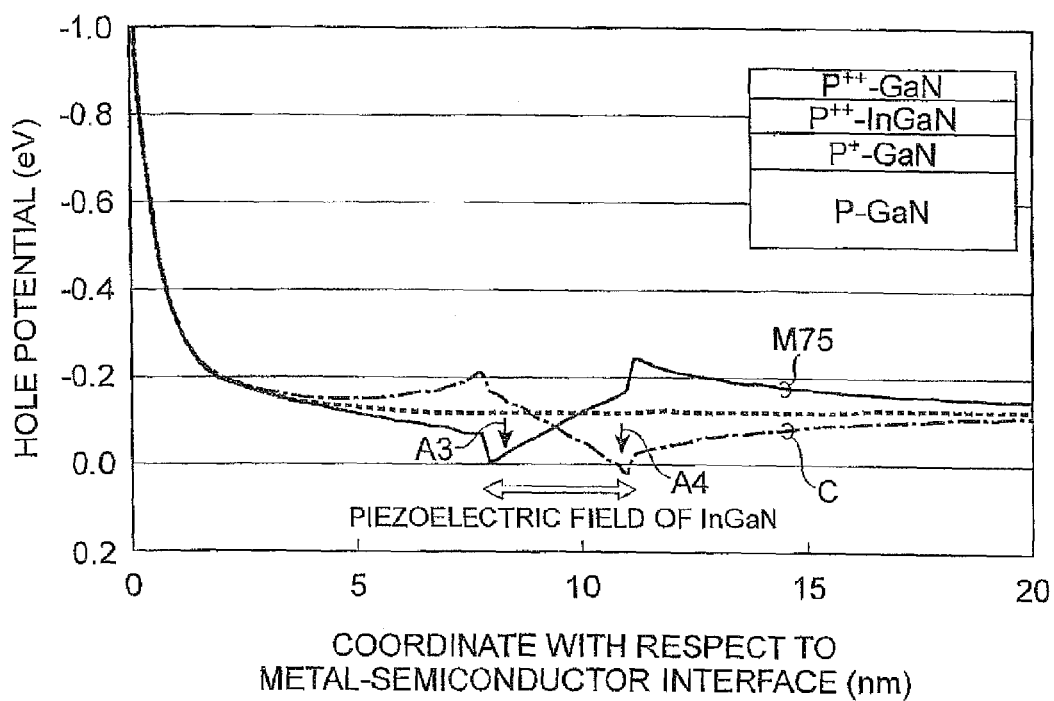
FIG. 3 is a view showing a potential diagram of a p-type contact structure in which a second p-type Group III nitride semiconductor layer incorporates compressive strain.

FIG. 3 is a view showing a potential diagram of the p-type contact structure in which a second p-type Group III nitride semiconductor layer 55 involves compression strain. FIG. 3 shows an example of calculation of the p-type contact structure provided on the (20-21) plane. The direction of the piezoelectric field acting in the second p-type Group III nitride semiconductor 55 is oriented in the direction from the third p-type Group III nitride semiconductor layer 57 to the first p-type Group III nitride semiconductor layer 53. FIG. 3 shows calculated potential lines, which are labelled as M75 and C, for an InGaN layer with an In composition Y of 5% on the (20-21) plane and an InGaN layer with an In composition Y of 5% on the (0001) plane, respectively.

Referring to FIG. 3, in the structure in which the InGaN layer is sandwiched by two gallium nitride based semiconductor layers, a band indicated by Arrow A3 is lowered by the piezoelectric field in the InGaN layer on the plane (20-21). This lowering causes the potential barrier at the metal-semiconductor junction interface to become thin in thickness, which allows carriers to easily tunnel the interface barrier. This is useful in reduction of the contact resistance.

InGaN with an In composition exceeding 10% (Y=0.1) provides a large action of lowering the band (i.e., characteristics of a physical contact between a metal and a semiconductor) at an interface between the InGaN layer and the GaN layer that is located at the side of the InGaN layer close to the electrode. On the other hand, the junction formed by the other GaN layer and the InGaN layer creates a barrier in the band structure thereof. This barrier may make the contact resistance exhibiting an electrical property of the entire device large. When the InGaN layer has a large thickness, the potential of the InGaN layer with the large thickness may prevent carriers from flowing therethrough. As a result, the contact resistance across the total device may be increased.

The p-type contact structure of the Group III nitride semiconductor device includes: a p-type Group III nitride semiconductor region (51) provided in contact with the primary surface (for example, the primary surface 23a) that is tilted at an angle in the range of 50 degrees or more and 80 degrees or less with respect to the c-plane of the Group III nitride semiconductor of the Group III nitride semiconductor layer (for example, the second cladding layer 23) acting as a base; and an electrode (16) provided on the p-type Group III nitride semiconductor region. The p-type Group III nitride semiconductor region (51) includes a first p-type Group III nitride semiconductor layer (53), a second p-type Group III nitride semiconductor layer (55), and a third p-type Group III nitride semiconductor layer (57). The first p-type Group III nitride semiconductor layer (53), the second p-type Group III nitride semiconductor layer (55), and the third p-type Group III nitride semiconductor layer (57) are arranged in the direction from the electrode (16) to the Group III nitride semiconductor layer (23) along the axis normal to the primary surface (for example, the primary surface 23a). The electrode (16) is in contact with the first p-type Group III nitride semiconductor layer (53) to form a metal-semiconductor interface J0. The first p-type Group III nitride semiconductor layer (53) forms a first heterojunction HJ1 with the second p-type Group III nitride semiconductor layer (55), and the second p-type Group III nitride semiconductor layer (55) forms a second heterojunction HJ2 with the third p-type Group III nitride semiconductor layer (57), and both junctions cause the second p-type Group III nitride semiconductor layer (55) to incorporate strain. In the present example, the third p-type Group III nitride semiconductor layer (57) forms a junction J1 with the surface of the base layer (for example, the primary surface 23a). The first heterojunction HJ1 extends along the reference plane, which is parallel to the surface (for example, the primary surface 23a) of the base layer or the semipolar primary surface (primary surface of substrate) 17a. The second heterojunction HJ2 extends along a reference plane, which is parallel to the surface (for example, the primary surface 23a) of the base layer or the semipolar primary surface 17a. The metal-semiconductor interface J0 extends along the reference plane, which is parallel to the surface (the primary surface 23a) of the base layer or the semipolar primary surface 17a.

According to this p-type contact structure, an interface barrier is formed at the metal-semiconductor interface that the contact between the electrode (16) and the first p-type Group III nitride semiconductor layer (53) forms, and the interface barrier is reflected in a contact resistance of the Group III nitride semiconductor device. The first p-type Group III nitride semiconductor layer (53) forms a first heterojunction HJ1 with the second p-type Group III nitride semiconductor layer (55), and this second p-type Group III nitride semiconductor layer (55) thus strained changes a band of the first p-type Group III nitride semiconductor layer (53) via the first heterojunction HJ1. This change in the band reduces the height of the interface barrier formed at the metal-semiconductor interface, when the primary surface (primary surface 23a) of the base in the p-type Group III nitride semiconductor region (51) is tilted at an angle in the range from 50 degrees or more to less than 80 degrees. Thus, this is effective in reduction of the contact resistance of the Group III nitride semiconductor device.

Based on the results of calculation, and additional experiments and consideration, the Group III nitride semiconductor laser device 11 can be provided with the following structure.

In the Group III nitride semiconductor laser device 11, the second p-type Group III nitride semiconductor layer 55 may have an acceptor concentration preferably in the range from −20% or more to +20% or less with respect to the acceptor concentration of the first p-type Group III nitride semiconductor layer 53. The third p-type Group III nitride semiconductor layer 57 may have an acceptor concentration lower than the first p-type Group III nitride semiconductor layer 53 and the second p-type Group III nitride semiconductor layer 55. This structure can prevent the reduction in crystal quality of the first p-type Group III nitride semiconductor layer 53 and the second p-type Group III nitride semiconductor layer 55, which are grown on the third p-type Group III nitride semiconductor layer 57, because the third p-type Group III nitride semiconductor layer 57 has an acceptor concentration lower than the first p-type Group III nitride semiconductor layer 53 and the second p-type Group III nitride semiconductor layer 55. Moreover, the above structure can reduce the influence of the barrier in the second p-type Group III nitride semiconductor layer 55, because the second p-type Group III nitride semiconductor layer 55 has an acceptor concentration in the range from −20% or more to +20% or less with respect to the acceptor concentration of the first p-type Group III nitride semiconductor layer 53.

In the Group III nitride semiconductor laser device 11, the first p-type Group III nitride semiconductor layer 53 is different in constituent from the second p-type Group III nitride semiconductor layer 55. The third p-type Group III nitride semiconductor layer 57 is different in constituent from the second p-type Group III nitride semiconductor layer 55. The Group III nitride semiconductor in the second p-type Group III nitride semiconductor layer 55 may have a constituent element(s) of at least one of indium (In) or aluminum (Al). This structure allows the second p-type Group III nitride semiconductor layer 55 to easily incorporate strain when the Group III nitride semiconductor in the second p-type Group III nitride semiconductor layer 55 contains a constituent(s) of at least one of indium (In) or aluminum (Al).

In the Group III nitride semiconductor laser device 11, the second p-type Group III nitride semiconductor layer 55 may have a thickness of 2 nm or mare, and a thickness of 10 nm or less. The strain of the second p-type Group III nitride semiconductor layer 55 works to reduce the interface barrier at the metal-semiconductor interface J0 formed by the first p-type Group III nitride semiconductor layer 53 and the electrode 16 whereas the second p-type Group III nitride semiconductor layer 55 itself forms the band barrier therein. The appearance of an influence of the band barrier can be reduced by the second p-type Group III nitride semiconductor layer 55 with a thickness fallen within the above range.

In the Group III nitride semiconductor laser device 11, at least one of Mg or Zn can be used as a dopant for p-type conductivity.

In the Group III nitride semiconductor laser device, the primary surface 23a, used as a growth surface thereon, of the Group III nitride semiconductor layer (for example, the second cladding layer 23) acting as a base can be tilted relative to the c-plane of the Group III nitride semiconductor in the Group III nitride semiconductor layer at an angle in the range of 63 degrees or more and less than 80 degrees. Using this angle range can further enhance an effect of lowering the interface barrier, which is caused by the strained second p-type Group III nitride semiconductor layer 55, at the metal-semiconductor interface J0. Moreover, the semipolar primary surface 17a can be tilted relative to the c-plane of the Group III nitride semiconductor at an angle in the range of 63 degrees or more and less than 80 degrees.

In the Group III nitride semiconductor laser device 11, the material of the third p-type Group III nitride semiconductor layer 57 can be the same as that of the first p-type Group III nitride semiconductor layer 53. The first p-type Group III nitride semiconductor layer 53 and the third p-type Group III nitride semiconductor layer 57 which are made of the same material can easily apply strain to the second p-type Group III nitride semiconductor layer 55. A more specific structure is as follows: the first p-type Group III nitride semiconductor layer 53 and the third p-type Group III nitride semiconductor layer 57 which comprise GaN can easily apply strain to the second p-type Group III nitride semiconductor layer 55.

In the Group III nitride semiconductor laser device 11, when the second p-type Group III nitride semiconductor layer 55 contains AlGaN, the second p-type Group III nitride semiconductor layer involves tensile strain. For example, in the Group III nitride semiconductor laser device 11, AlGaN contained in the second p-type Group III nitride semiconductor layer 55 may have an Al composition of 2% or more, and may have an Al composition of 10% or less. This range of the Al composition can provide the action of reducing the interface barrier, which is caused by the strain of the second p-type Group III nitride semiconductor layer, at the metal-semiconductor interface can be obtained, and AlGaN with the above range of the Al composition can reduce the appearance of an influence of the band barrier in the AlGaN itself. The AlGaN with an Al composition of 2% or more can provide a significant action of reducing the interface barrier, which is caused by the strain of the second p-type Group III nitride semiconductor layer, at the metal-semiconductor interface. The AlGaN with an Al composition of 10% or less can reduce the appearance of an influence of the band barrier produced by AlGaN itself. Moreover, in the second p-type Group III nitride semiconductor layer 55, the AlGaN layer can have a thickness of 2 nm or more, and a thickness of 10 nm or less. The AlGaN with a thickness of the above range can provide an action of reducing the interface barrier, which is caused by the strain of the second p-type Group III nitride semiconductor layer, at the metal-semiconductor interface and can reduce the appearance of an influence of the band barrier produced by the AlGaN itself. The lower limit of the thickness of the AlGaN layer is determined on the basis of that an action of reducing the interface barrier, which is caused by the strain of the second p-type Group III nitride semiconductor layer, at the metal-semiconductor interface can be dominantly obtained. The upper limit of the thickness of the AlGaN is determined on the basis of that the manifestation of an influence of the band barrier of AlGaN itself can be reduced.

In the Group III nitride semiconductor laser device 11, when the second p-type Group III nitride semiconductor layer 55 contains InGaN, the second p-type Group III nitride semiconductor layer 55 involves compressive strain. For example, in the Group III nitride semiconductor laser device 11, InGaN of the second p-type Group III nitride semiconductor layer 55 may have an In composition of 2% or more, and an In composition of 10% or less. The InGaN with an In composition of the above range can provide an action of reducing the interface barrier, caused by the strain of the second p-type Group III nitride semiconductor layer, at the metal-semiconductor interface, and can reduce the manifestation of an influence of the band barrier produced by the InGaN itself. The InGaN with the In composition of 2% or more can provide a significant action of reducing the interface barrier, which is caused by the strain of the second p-type Group III nitride semiconductor layer, at the metal-semiconductor interface. The InGaN with an In composition of 10% or less can reduce the manifestation of an influence of the band barrier produced by the InGaN itself. Moreover, in the second p-type Group III nitride semiconductor layer 55, the thickness of the InGaN layer can be 2 nm or more and the thickness of the InGaN layer can be 10 nm or less. The InGaN with a thickness in the above range can provide an action of reducing the interface barrier, which is caused by the strain of the second p-type Group III nitride semiconductor layer, at the metal-semiconductor interface, and can reduce the manifestation of an influence of the band barrier produced by the InGaN itself. The lower limit of the thickness of the InGaN layer is determined on the basis of that an action of reducing the interface barrier, caused by the strain of the second p-type Group III nitride semiconductor layer, at the metal-semiconductor interface can be dominantly obtained. The upper limit of the thickness of InGaN is determined on the basis of that the manifestation of an influence of the band barrier produce by the InGaN itself. The second p-type Group III nitride semiconductor layer 55 may have a thickness lower than the first p-type Group III nitride semiconductor layer 53.

In the Group III nitride semiconductor laser device 11, the first p-type Group III nitride semiconductor layer 53 can have a thickness of 50 nm or less. The first p-type Group III nitride semiconductor layer 53 with the thickness in the above range can provide the metal-semiconductor interface with an effect of a piezoelectric polarization created at heterojunction 1-1.11 between the first p-type Group III nitride semiconductor layer 53 and the second p-type Group III nitride semiconductor layer 55. The first p-type Group III nitride semiconductor layer 53 can have a thickness of 2 nm or more.

The first p-type Group III nitride semiconductor layer 53 has an acceptor concentration preferably higher than the third p-type Group III nitride semiconductor layer. In the Group III nitride semiconductor laser device 11, the first p-type Group III nitride semiconductor layer 53 may have an acceptor concentration of, for example, $1\times10^{20}$ cm$^{-3}$ or more. When the first p-type Group III nitride semiconductor layer has an acceptor concentration of $1\times10^{20}$ cm$^{-3}$ or more, the barrier height at the metal-semiconductor interface can be reduced by the action of such a high acceptor concentration. The second p-type Group III nitride semiconductor layer 55 may have an acceptor concentration of, for example, $1\times10^{20}$ cm$^{-3}$ or more. When the second p-type Group III nitride semiconductor layer has an acceptor concentration of $1\times10^{20}$ cm$^{-3}$ or more, the potential barrier of the second p-type Group III nitride semiconductor layer 55 can be reduced by the action of such a high acceptor concentration.

In the Group III nitride semiconductor laser device 11, when the third p-type Group III nitride semiconductor layer 57 has an acceptor concentration of $1\times10^{19}$ cm$^{-3}$ or more, such an acceptor impurity concentration can prevent the third p-type Group III nitride semiconductor layer 57 from having a large specific resistance. Moreover, when the third p-type Group III nitride semiconductor layer 57 has an acceptor concentration of less than $5\times10^{19}$ cm$^{-3}$, this acceptor concentration range can avoid the reduction in crystal quality caused by the acceptor concentration made higher.

As described above, when the Group III nitride semiconductor device according to the present embodiment includes an active layer for a light emitting device, the Group III nitride semiconductor light emitting device can be provided with the reduced barrier at the metal-semiconductor interface.

Specific examples of the p-type contact structure are shown below.
First semiconductor layer 53, Second semiconductor layer 55, Third semiconductor layer 55.
p-type GaN, p-type AlGaN, p-type GaN.
p-type GaN, p-type InGaN, p-type GaN.
p-type GaN, p-type InAlGaN, p-type GaN.
p-type GaN, p-type InAlN, p-type GaN.

Alternatively, the Group III nitride semiconductor device according to the present embodiment can includes an electronic device. The barrier at the metal-semiconductor interface can be reduced in the electronic device comprising the Group III nitride semiconductor. Here, the electronic device encompasses a DEW element, a bipolar transistor element, and the like, for example.

Specifically, the electronic device has the following structure. When the electronic device comprises a pn junction diode, an anode is in contact with the p-type Group III nitride semiconductor region. When the electronic device comprises a HEMT element, a Ni/Au electrode is in contact with the p-type Group III nitride semiconductor region. When the electronic device comprises a bipolar transistor, a Ni/Au electrode is in contact with the p-type Group III nitride semiconductor region.

Again referring to FIG. 1, a semiconductor region 19 includes a first region 19b, a second region 19c, and a third region 19d, and the first to third regions 19b to 19d each extends in the direction of the waveguide axis (the direction of the waveguide axis represented by a waveguide vector LGV). This waveguide axis extends in the direction from the first end face (for example, the first fractured face 27) to the second end face (for example, the second fractured face 29). The third region 19d is provided between the first region 19b and the second region 19c. The opening 31a of the insulating film 31 is positioned on the third region 19d of the semiconductor region 19. The third region 19d can form a ridge structure of the semiconductor region 19.

The electrode 15 includes an electrode 16 and a pad electrode 18. The electrode 16 (for example, an ohmic electrode) forms an ohmic contact with the third region 19d in the semiconductor region 19 via the opening 31a of the insulating film 31. The pad electrode 18 includes a first portion 18b, a second portion 18c, and the third portion 18d, and the first to third portions 18b to 18d are provided on the first to third regions 19b to 19d in the semiconductor region 19, respectively. The electrode 16 (for example, an ohmic electrode) can comprise, for example, Pd. The Pd electrode can provide an excellent electrical contact with a semipolar surface, which is susceptible to oxidation. The pad electrode 18 can be formed of, for example, Ti/Pt/Au.

As shown in FIG. 1, the Group III nitride semiconductor laser device 11 further includes dielectric multilayer films 43 and 44, which are provided on the first fractured face 27 and the second fractured face 29, respectively. The end face coating can be applied to the first fractured face 27 and the second fractured face 29. The end face coating can adjust the reflectance thereof.

The dielectric multilayer film 43 is provided on one end of the support base 17 and the one end of the semiconductor region 19, and the first fractured face 27 is formed of, for example, these end faces. The deposition for the dielectric multilayer film 43 is provided on the one end of the electrode 15 (pad electrode 18). Moreover, the dielectric multilayer film 44 is provided on the other end of the support base 17 and the other end of the semiconductor region 19, and the second fractured face 29 is formed of, for example, these end faces. The deposition for the dielectric multilayer film 44 is provided on the other end face of the electrode 15 (pad electrode 18). According to this Group III nitride semiconductor laser device 11, the electrode 15 includes the electrode 16 and the pad electrode 18, and this electrode 16 (ohmic electrode) is in contact with the third region 19d in the semiconductor region 19 via the opening 31a of the insulating film 31. The thickness of the electrode 16 ranges, for example, from about 20 nm to about 100 nm, and the thickness of the pad electrode 18 ranges, for example, from about 0.2 μm to about 1 μm. An electric current from the electrode 15 is guided by the ridge structure to a portion of the semiconductor region (for example, the third region 19d) extending along the waveguide axis.

The active layer 25 can have a quantum-well structure provided so as to emit light at a wavelength of 500 nm or more. The utilization of the semipolar plane is favorable in the emission of light of a wavelength in a range of 500 nm or more and 550 nm or less. According to this Group III nitride semiconductor laser device 11, in order to obtain a lasing wavelength of 500 nm or more, the InGaN layer in the active layer 25 is required to have indium composition of 0.2 or more.

Referring to FIG. 1, an orthogonal coordinate system S and a crystal coordinate system CR are drawn. The normal axis NX is oriented in the direction of the Z-axis of the orthogonal coordinate system S. The semipolar primary surface 17a extends so as to be parallel with a predetermined plane defined by the X-axis and the Y-axis of the orthogonal coordinate system S. Moreover, in FIG. 1, a representative c-plane Sc is also drawn. The c-axis of the hexagonal crystal Group III nitride semiconductor in the support base 17 is tilted at an angle ALPHA, which is larger than zero, away from the normal axis NX toward the direction of the m-axis of the hexagonal crystal Group III nitride semiconductor.

In the Group III nitride semiconductor laser device 11, the c-axis of the hexagonal crystal Group III nitride semiconductor can be tilted away from the normal axis NX toward the direction of the m-axis of the hexagonal crystal Group III nitride semiconductor. In the structure in which the first fractured face 27 and the second fractured face 29 intersect with the m-n plane defined by the normal axis NX and the m-axis of the hexagonal crystal Group III nitride semiconductor as in the present example, the laser cavity of the Group III nitride semiconductor layer device 11 includes the first fractured face 27 and the second fractured face 29, and the laser waveguide therein extends from one of the first fractured face 27 and the second fractured face 29 to the other. The laser structure 13 includes a first face 13a and a second face 13b, and the first face 13a is opposite to the second face 13b. The first fractured face 27 and the second fractured face 29 extend from the edges (for example, edge 13c) of the first surface 13a to the edges (for example, edge 13d) of the second surface 13b, respectively. The first fractured face 27 and the second fractured face 29 are different from any of cleavage planes such as the c-plane, the m-plane, and the a-plane.

According to this Group III nitride semiconductor laser device 11, when the first fractured face 27 and the second fractured face 29 composing the laser cavity intersect with the m-n plane, a laser waveguide can be provided to extend in the direction of the intersection of the m-n plane with the semipolar surface (for example, the semipolar primary surface 17a of the substrate). Therefore, the Group III nitride semiconductor laser device 11 has a laser cavity that enables a low threshold current. Alternatively, the c-axis of the hexagonal crystal Group III nitride semiconductor can be tilted toward the a-axis of the hexagonal crystal Group III nitride semiconductor. With the alternative configuration, those skilled in the art can read the above description by replacing the "m-axis" with the "a-axis" to understand it.

The Group III nitride semiconductor laser device 11 includes an n-side optical guide layer 35 and a p-side optical guide layer 37. The n-side optical guide layer 35 includes a first portion 35a and a second portion 35b, and the n-side optical guide layer 35 is formed of GaN, InGaN, or the like, for example. The p-side optical guide layer 37 includes a first portion 37a and a second portion 37b, and the p-side optical guide layer 37 is formed of GaN, InGaN, or the like, for example. The rear surface 17b of the support base 17 (backside of support base) is provided with another electrode 41, and the electrode 41 covers the rear surface 17b of the support base 17, for example. In an example, a current block layer 39 may be provided between the first portion 37a and the second portion 37b, for example.

Example 1

FIG. 4 shows a structure of a laser diode for Example 1. The explanation of FIG. 4 is described below. In order from the left most column to the rightmost column in FIG. 4, the material name of the semiconductor layer, the thickness of the semiconductor layer, the dopant name, and the dopant concentration are listed. The dopant concentration, "3.0E+20," represents $3.0 \times 10^{20}$ cm$^{-3}$. The epitaxial stack structure of this laser diode is formed on the primary surface of the GaN substrate. This primary surface is inclined in the angle range of the above-described angle ALPHA (i.e., off angle). The semiconductor layers for this epitaxial stack structure is stacked in the direction of the axis normal to the primary surface. In this example, GaN substrates are prepared which have primary surfaces with the following plane orientations: the {20-21} plane (an angle between the normal axis and the m-axis being 75 degrees); the {11-22} plane (an angle between the normal axis and the a-axis being 58 degrees); and the {10-11} plane (an angle between the normal axis and the m-axis being 62 degrees). For example, organometallic vapor phase epitaxy can be used for the epitaxial growth.

The surface of each GaN substrate is subjected to thermal cleaning, and thereafter, a GaN layer with a thickness of 1.1 μm is grown thereon. Subsequently, on this GaN layer, an n-type $Al_{0.06}Ga_{0.94}N$ layer with a thickness of 1.0 μm is grown for an n-side cladding layer. On this AlGaN layer, an n-type GaN layer with a thickness of 500 nm and an n-type $In_{0.05}Ga_{0.95}N$ layer with a thickness of 80 nm are grown in this order for optical guide layers. On this n-type InGaN layer, an active layer is grown. The active layer includes one or more well layers of an undoped $In_{0.25}Ga_{0.75}N$ layer with a thickness of 3 nm, and one or more barrier layers of an undoped $In_{0.05}Ga_{0.95}N$ layer with a thickness of 3 nm. On the active layer, an undoped $In_{0.05}Ga_{0.95}N$ layer with a thickness of 50 nm is grown for an optical guide layer. On this InGaN layer, a p-type $Al_{0.06}Ga_{0.94}N$ layer with a thickness of 400 nm is grown for a p-side cladding layer. On this p-side cladding layer, a p-type Group III nitride semiconductor laminate is grown. For the p-type Group III nitride semiconductor laminate, a p-type GaN layer with a thickness of 40 nm, an $In_TAl_SGa_{1-T-S}N$ layer with a thickness of 3 nm, and a p-type GaN layer with a thickness of 10 nm are grown successively in this order. In the $In_TAl_SGa_{1-T-S}N$ layer, ternary InGaN, ternary AlGaN, and quaternary InAlGaN are grown as in experimental conditions.

FIG. 5 is a drawing showing a list of experimental conditions in Example 1.

Experimental condition name: Material and Composition of the second p-type Group III nitride semiconductor layer 55

Experimental condition 1: GaN.

Experimental condition 2: InGaN; In composition 0.01.

Experimental condition 3: InGaN; In composition 0.04.

Experimental condition 4: InGaN, In composition 0.10.

Experimental condition 5: AlGaN; Al composition 0.01.

Experimental condition 6: AlGaN; Al composition 0.04.

Experimental condition 7: AlGaN; Al composition 0.10.

Experimental condition 8: InAlGaN; In composition 0.04; Al composition: 0.04.

By the growth of the above epitaxial layers, eight kinds of epitaxial substrates are formed. On each of these epitaxial substrates, a patterned electrode is formed of Pd for a test element group (TEG) used to measure a contact resistance ρc (Ω cm$^2$) by the TLM method. A process for forming a laser diode of a ridge structure is applied thereto to produce a ridge structure with a ridge width of 2 μm. Then, Pd deposition for an anode electrode is performed, and Al deposition for a cathode electrode is performed on the rear surface of each substrate. A laser bar with a cavity length of 500 μm is produced, and thereafter, the end face coatings are performed. The reflectance of the front face is 50%, and the reflectance of the rear face is 95%.

The eight kinds of laser diodes produced as described above lased at a wavelength of 525 nm and at a threshold current Ith of 50 mA. In each of these laser diodes, a forward voltage, "Vf," is measured where "Vf" is defined as a voltage at a voltage at the application current of 50 mA.

FIG. 5 shows the measurement results.
Experimental condition name: Contact resistance ρc (in Ω cm$^2$),
Forward voltage Vf (in V).
Experimental condition 1: 5×10$^{-4}$; 4.5.
Experimental condition 2: 1×10$^{-4}$; 4.2.
Experimental condition 3: 1×10$^{-4}$; 4.2.
Experimental condition 4: 1×10$^{-4}$; 4.8.
Experimental condition 5: 1×10$^{-4}$; 4.2.
Experimental condition 6: 1×10$^{-4}$; 4.2.
Experimental condition 7: 1×10$^{-4}$; 4.8.
Experimental condition 8: 1×10$^{-4}$; 4.2.
The contact resistances, ρc, in the experimental conditions 2 to 8 are smaller compared with that in the experimental condition 1.

Therefore, when the second p-type Group III nitride semiconductor layer 55 incorporates strain, the barrier at the metal-semiconductor interface effectively becomes thin in thickness by the action of the piezoelectric field. This shows that the present examples can provide a nitride semiconductor device having a structure capable of improving the features of physical contact between a p-type nitride semiconductor region and an electrode. Moreover, the present example can provide a p-type contact structure having a structure capable of improving the features of physical contact between a p-type nitride semiconductor region and an electrode.

The forward voltages, "Vfs," in the experimental conditions 2 to 3, 5 to 6, and 8 are small as compared with the experimental conditions 1, 4, and 7. This shows that the piezoelectric filed of the second p-type Group III nitride semiconductor layer 55 causes the barrier at the metal-semiconductor interface to be thin in thickness by exerting the action of lowering the band of the first p-type Group III nitride semiconductor layer 53, and on the other hand, the second p-type Group III nitride semiconductor layer 55 itself acts as a barrier.

As described above, it is preferred that not only the action of lowering the band by the piezoelectric field of the second p-type Group III nitride semiconductor layer 55, but also the barrier by the second p-type Group III nitride semiconductor layer 55 itself be considered as features of the devices. In the forward voltage "Vf," the tunneling probability of carriers depends on both of the thickness and the band discontinuity (i.e., Al composition and/or In composition) at the hetero interface. The consideration of this viewpoint by the inventors of the present invention reveals that the range of favorable characteristics of the devices can be defined by the product of the composition (Al composition or In composition) and the thickness of the second p-type Group III nitride semiconductor layer 55, i.e., "thickness×composition". As to AlGaN, the range of favorable characteristics of the devices is defined by the following conditional expression:
Assuming that the Al composition is indicated by "x" [in %], the thickness is indicated by "a" [in nm], $1 < x \times a < 25$.
As to InGaN, the range of favorable characteristics of the devices is defined by the following conditional expression:
Assuming that the In composition is indicated by "y" [in %], and the thickness is indicated by "b" [in nm], $1 < y \times b < 25$.
As to this InAlGaN, the range of favorable characteristics of the devices is defined by the following conditional expression:
Assuming that the Al composition is indicated by "x" [in %], the In composition is indicated by "y" [in %], and the thickness is indicated by "c" [in nm], $1 < |x/5-y| \times c < 25$.

Figure 6A:
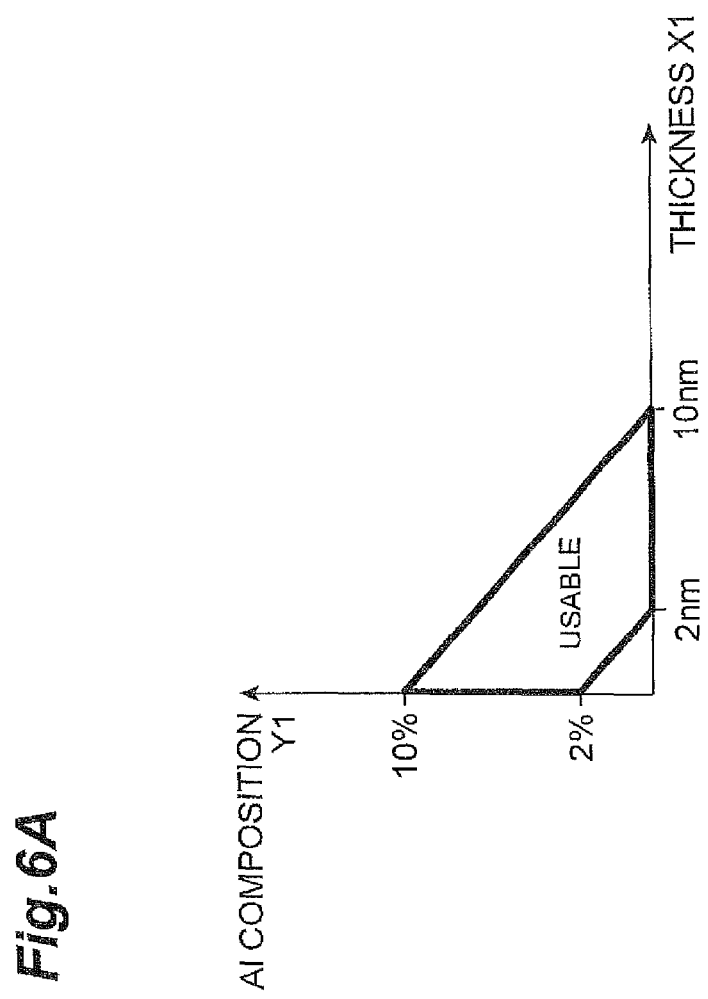
FIG. 6A is a view explaining a favorable range, which provides the device with a good performance, defined by the film thickness indicated by the horizontal axis and the Group III constituent element indicated by the vertical axis.
Figure 6B:
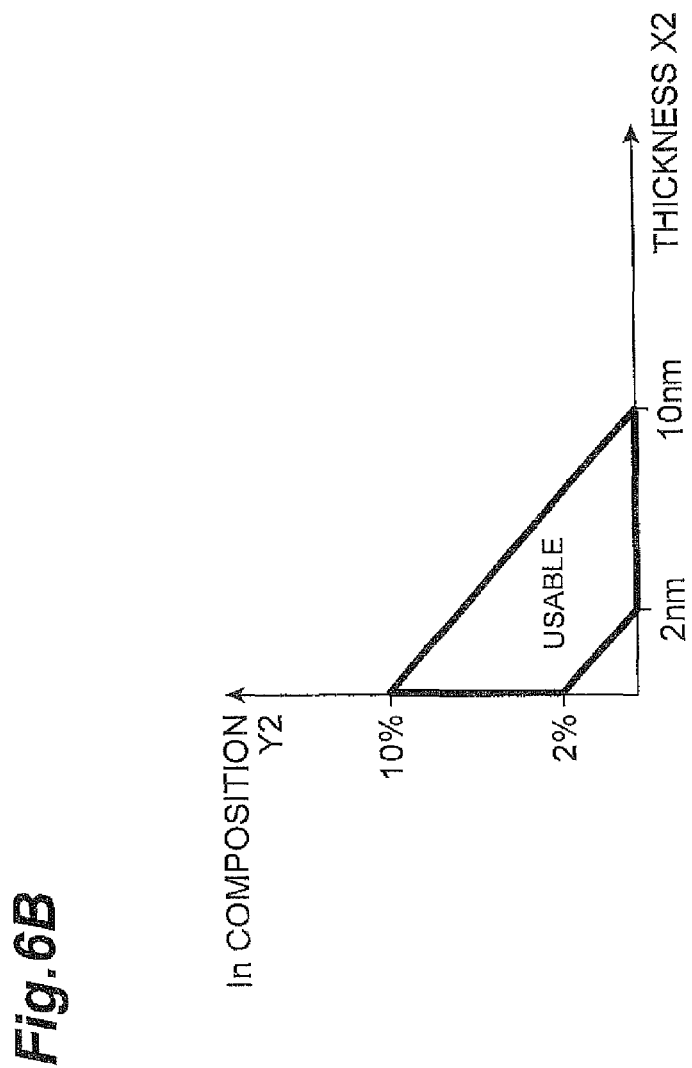
FIG. 6B is a view explaining a favorable range, which provides the device with a good performance, defined by the film thickness indicated by the horizontal axis and the Group III constituent element indicated by the vertical axis.

In each of FIGS. 6A and 6B, the horizontal axis indicates the thickness of the layer, the vertical axis indicates the Group III element, and the range of favorable characteristics of the devices is defined therein. Referring to FIG. 6A, when the second p-type Group III nitride semiconductor layer 55 includes AlGaN, as to this AlGaN, the range of favorable characteristics of the devices is defined by the following conditional expression.

(The thickness of the layer 55) is represented by a variable X1.
(The Al composition of the layer 55) is represented by a variable Y1.

$$X1>0$$

$$Y1>0$$

$$Y1>-X1+0.02$$

$$Y1<-X1+0.10$$

Referring to FIG. 6B, when the second p-type Group III nitride semiconductor layer 55 includes InGaN, as to this InGaN, the range of favorable characteristics of the devices is defined by the following conditional expression.

(The thickness of the layer 55) is represented by a variable X2.
(The In composition of the layer 55) is represented by a variable Y2.

$$X2>0$$

$$Y2>0$$

$$Y2>-X2+0.02$$

$$Y2<-X2+0.10$$

The present embodiments can provide a nitride semiconductor device having a structure capable of reducing a contact resistance of a p-type contact including a physical contact between a p-type nitride semiconductor region and an electrode. The present embodiments also can provide a p-type structure having a structure capable of reducing a contact resistance at a p-type contact including a physical contact between a p-type nitride semiconductor region and an electrode.

The laser diodes obtained under the experimental conditions 2, 3, 5, 6 and 8 are subjected to a energization lifetime test under constant-output control (APC). This lifetime test showed that the extent of increase in Vf caused by the energization was made reduced, and that the forward voltage Vf exhibited increase in voltage only by about 10% until an increase of 30% in operating current fop. On the other hand, in the lifetime test to the laser diode of Experimental condition 1, the increase in forward voltage Vf was about 50%.

Figure 7:
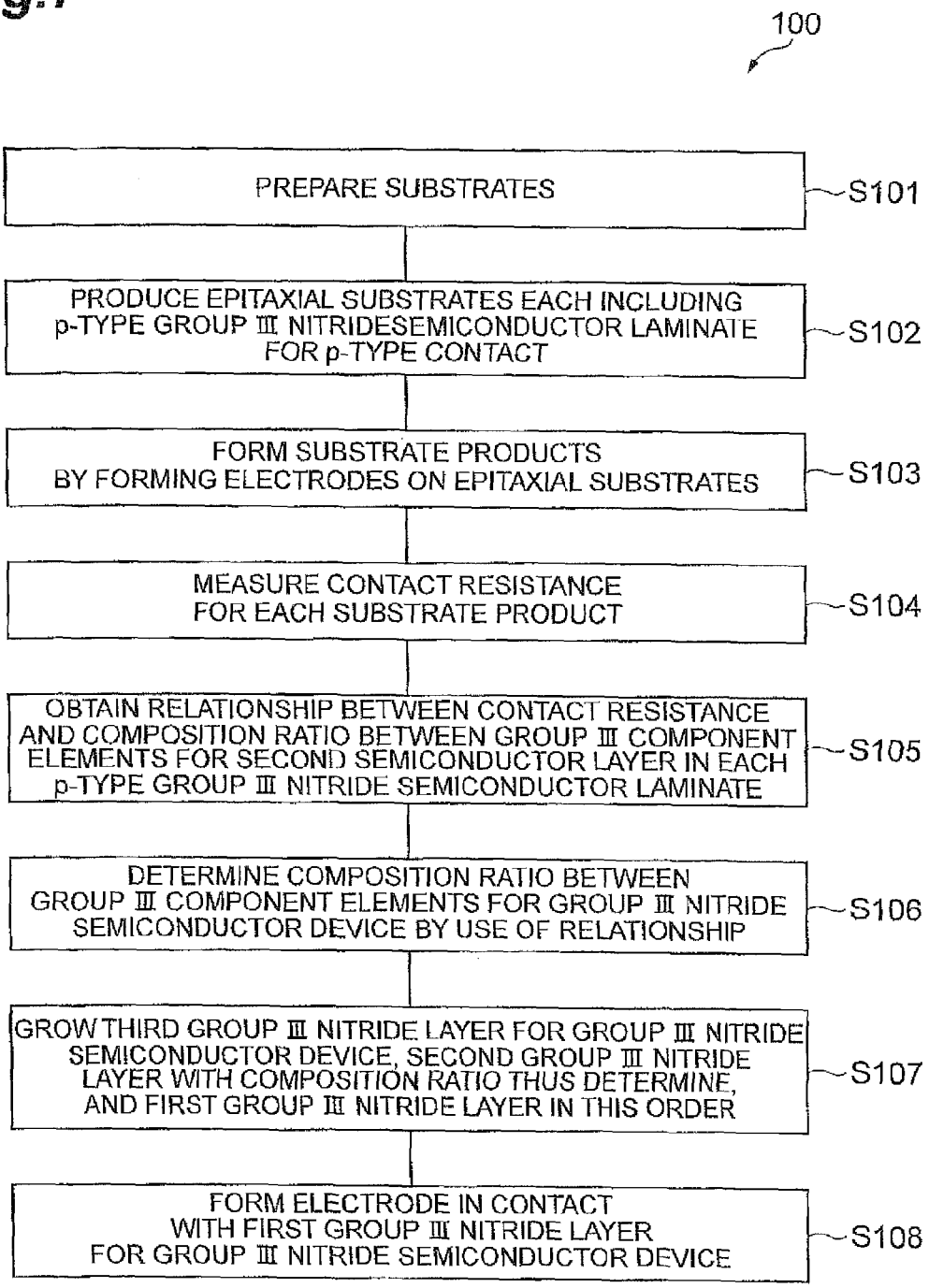
FIG. 7 is a drawing showing main steps in the method for producing a Group III nitride semiconductor device according to an embodiment of the present invention.

FIG. 7 is a drawing showing main steps in the method for producing a Group III nitride semiconductor device (hereinafter referred to as the "production method") of the present example. The method for producing a Group III nitride semiconductor device is described with reference to the step flow 100. In the subsequent description, in order to facilitate understanding, the same reference numerals in the embodiment described with reference to FIG. 1 are used, if possible.

In the step S101, plural substrates each having a primary surface formed of a Group III nitride semiconductor are provided. For example, as described in Example 1, GaN substrates can be prepared. In the provision of the substrates, the plane orientations of the primary surfaces of the respective substrates are preferably the same or substantially the same among the plural substrates. The angles corresponding to the plane orientations of the primary surfaces of the substrates are not limited to the above-described angle range and can be selected from a wider angle range. It is preferred that the plane orientations of the primary surfaces of the substrates be in the angle range of the semipolar plane that is opposite in piezoelectric field to that of the c-plane (polarity plane).

In the step S102, plural epitaxial substrates are formed therefrom. Each of the plural epitaxial substrate includes a p-type nitride semiconductor laminate, and in order to form the p-type nitride semiconductor laminate, a first p-type Group III nitride semiconductor layer, a second p-type Group III nitride semiconductor layer containing a first Group III element and a second Group III element, and a third p-type. Group III nitride semiconductor layer can be grown thereon by, for example, organometallic vapor phase epitaxy. The first Group III nitride layer can include a gallium nitride based semiconductor, the second Group III nitride layer can include a gallium nitride based semiconductor, and the third Group III nitride layer can include a gallium nitride based semiconductor. A combination of the first p-type Group III nitride semiconductor layer, the second p-type Group III nitride semiconductor layer, and the third p-type Group III nitride semiconductor layer encompasses, for example, GaN/InGaN/GaN, GaN/AlGaN/GaN, and GaN/InAlGaN/GaN. In the formation of plural epitaxial substrates, the third p-type Group III nitride semiconductor layer, the second p-type Group III nitride semiconductor layer, and the first p-type Group III nitride semiconductor layer are grown on the primary surface of each substrate in this order. In at least one of the plural epitaxial substrates, the second p-type Group III nitride semiconductor layer involves strain by being sandwiched by the first p-type Group III nitride semiconductor layer and the third p-type Group III nitride semiconductor layer. Therefore, in the formation of the plural epitaxial substrates, the second p-type Group III nitride semiconductor layer in each epitaxial substrate is grown so as to have a different ratio between the first Group III element and the second Group III element, than the others to provide the second p-type Group III nitride semiconductor layer thus formed with a different strain. For example, the first Group III element can be indium, and when the first Group III element is indium, the second Group III element can be gallium. Alternatively, the second Group III element can be aluminum, and when the second Group III element is aluminum, the first Group III element can be gallium. In addition, in the quaternary Group III nitride, the third Group III element is different from the first Group III element and the second Group III element and is any of Group III elements (gallium, indium, and aluminum).

In the step S103, plural substrate products are formed therefrom. In order to form the plural substrate products, an electrode in contact with the surface of the p-type nitride semiconductor laminate in each epitaxial substrate is formed. The electrode is formed by, for example, vapor deposition with palladium.

In the step S104, the contact resistance between the surface of p-type nitride semiconductor laminate and the electrode in each of the substrate products is measured. This measurement is performed by, for example, the TLM method.

In the step S105, by the measurement for each substrate product, a relationship between an element ratio (ratio between the first Group III element and the second Group III element) in each substrate product and the contact resistance in each substrate product can be obtained.

In the step S106, in order to product a Group III nitride semiconductor device (for example, Group III nitride semiconductor laser device 11), a composition ratio between the first Group III constituent element and the second Group III constituent element for the second p-type Group III nitride semiconductor layer is determined based on the above-described relationship.

In the step S107, in order to produce a Group III nitride semiconductor device, a plurality of Group III nitride layers (for example, the first p-type Group III nitride semiconductor layer 53, the second p-type Group III nitride semiconductor layer 55, and the third p-type Group III nitride semiconductor layer 57) are epitaxially grown to form them. A third Group III nitride layer (for example, the third p-type Group III nitride semiconductor layer 57) is grown while doping an acceptor to form it in contact with the primary surface of a base layer. A second Group III nitride layer (for example, the second p-type Group III nitride semiconductor layer 55) having determined composition is grown while doping an acceptor to form it in contact with the primary surface of the third Group ITT nitride layer. A first Group III nitride layer (for example, the first p-type Group III nitride semiconductor layer 53) is grown while doping an acceptor to form it in contact with the primary surface of the second Group III nitride layer.

In the step S108, in order to product a Group III nitride semiconductor device, an electrode 16 is formed on the primary surface of the first Group III nitride layer. This electrode 16 is in contact with the surface of the first Group III nitride layer.

According to this production method, in the formation of epitaxial substrates, a second p-type Group III nitride semiconductor layer in each epitaxial substrate is grown so as to have a different Group III element ratio between the first Group III element and the second Group III element, and a contact resistance between the surface of the p-type nitride semiconductor and the electrode in each of the plural substrates products having the respective second p-type Group III nitride semiconductor layers is measured. By use of the relationship between the Group III element ratio of each substrate product and the contact resistance of each substrate product, the element composition of the first Group III element and the second Group III element for the second p-type Group III nitride semiconductor layers which can reduce the contact resistance by the action of the piezoelectric field can be determined. Thereafter, in order to product a Group III nitride semiconductor device, a third Group III nitride layer having substantially the same composition of the third p-type Group III nitride semiconductor layer, a second Group III nitride layer using the determined element composition, and a first Group III nitride layer having substantially the same composition as the first p-type Group III nitride semiconductor layer are grown in this order. Then, in order to produce the Group ITT nitride semiconductor device, an electrode is formed in contact with the surface of the first Group III nitride layer. The Group III nitride semiconductor device thus formed can reduce a forward voltage by the action of piezoelectric polarization.

The above embodiments each can provide a nitride semiconductor device having a structure capable of improving features of a physical contact between a p-type nitride semiconductor region and an electrode; a p-type contact structure capable of improving features of a physical contact between a p-type nitride semiconductor region and an electrode; and a method for fabricating a nitride semiconductor light emitting device capable of producing a structure that is capable of improving features of a physical contact between a p-type nitride semiconductor region and an electrode.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A Group III nitride semiconductor device comprising:
a Group III nitride semiconductor layer having a primary surface including a Group III nitride semiconductor, the primary surface being inclined with respect to a c-plane of the Group III nitride semiconductor at an angle in a range of 50 degrees or more and 80 degrees or less;
a p-type Group III nitride semiconductor laminate including a first p-type Group III nitride semiconductor layer, a second p-type Group III nitride semiconductor layer and a third p-type Group III nitride semiconductor layer, the first p-type Group III nitride semiconductor layer, the second p-type Group III nitride semiconductor layer and the third p-type Group III nitride semiconductor layer being provided on the primary surface of the Group III nitride semiconductor layer, the second p-type Group III nitride semiconductor layer being sandwiched between the first p-type Group III nitride semiconductor layer and the third p-type Group III nitride semiconductor layer such that the second p-type Group III nitride semiconductor layer incorporates strain; and
an electrode provided on the p-type Group III nitride semiconductor laminate,
the electrode being in contact with the first p-type Group III nitride semiconductor layer,
the first p-type Group III nitride semiconductor layer, the second p-type Group III nitride semiconductor layer and the third p-type Group III nitride semiconductor layer being arranged in a direction from the electrode to the Group III nitride semiconductor layer along an axis normal to the primary surface, and
wherein the second p-type Group III nitride semiconductor layer has a thickness of not less than 2 nm and a thickness of not more than 10 nm.

2. The Group III nitride semiconductor device according to claim 1, wherein
a constituent of the first p-type Group III nitride semiconductor layer is different from that of the second p-type Group III nitride semiconductor layer,
a constituent of the third p-type Group III nitride semiconductor layer is different from that of the second p-type Group III nitride semiconductor layer, and
a Group III nitride semiconductor of the second p-type Group III nitride semiconductor layer contains at least one constituent of indium (In)) or aluminum (Al).

3. The Group III nitride semiconductor device according to claim 1, wherein
an acceptor in the first p-type Group III nitride semiconductor layer comprises at least one of Mg or Zn;
an acceptor in the second p-type Group III nitride semiconductor layer comprises at least one of Mg or Zn; and
an acceptor in the third p-type Group III nitride semiconductor layer comprises at least one of Mg or Zn.

4. The Group III nitride semiconductor device according to claim 1, wherein the surface of the Group III nitride semiconductor layer is inclined with respect to the c-plane of the Group III nitride semiconductor layer at an angle in a range of not less than 63 degrees and less than 80 degrees.

5. The Group III nitride semiconductor device according to claim 1, wherein material of the first p-type Group III nitride semiconductor layer is the same as that of the third p-type Group III nitride semiconductor layer.

6. The Group III nitride semiconductor device according to claim 1, wherein the first p-type Group III nitride semiconductor layer comprises GaN.

7. The Group III nitride semiconductor device according to claim 1, wherein the second p-type Group III nitride semiconductor layer comprises AlGaN.

8. The Group III nitride semiconductor device according to claim 7, wherein the AlGaN of the second p-type Group III nitride semiconductor layer has an Al composition of not less than 0.02 and not more than 0.1.

9. The Group III nitride semiconductor device according to claim 1, wherein the second p-type Group III nitride semiconductor layer comprises InGaN.

10. The Group III nitride semiconductor device according to claim 9, wherein the InGaN of the second p-type Group III nitride semiconductor layer has an In composition of not less than 0.02 and not more than 0.1.

11. The Group III nitride semiconductor device according to claim 1, wherein the first p-type Group III nitride semiconductor layer has a thickness of not more than 50 nm.

12. The Group III nitride semiconductor device according to claim 1, wherein the second p-type Group III nitride semiconductor layer has an acceptor concentration in a range of −20 percent to +20 percent of an acceptor concentration of the first p-type Group III nitride semiconductor layer, and
the third p-type Group III nitride semiconductor layer has an acceptor concentration lower than acceptor concentrations of the first and second p-type Group III nitride semiconductor layers.

13. The Group III nitride semiconductor device according to claim 1, wherein an acceptor concentration of the first p-type Group III nitride semiconductor layer is not less than $1 \times 10^{20}$ cm$^{-3}$; and an acceptor concentration of the second p-type Group III nitride semiconductor layer is not less than $1 \times 10^{20}$ cm$^{-3}$.

14. The Group III nitride semiconductor device according to claim 1, wherein an acceptor concentration of the third p-type Group III nitride semiconductor layer is not less than $1 \times 10^{19}$ cm$^{-3}$ and is less than $5 \times 10^{19}$ cm$^{-3}$.

15. The Group III nitride semiconductor device according to claim 1, further comprising an active layer for a light emitting layer, the Group III nitride semiconductor layer having an n-type conductivity, and the active layer is provided between the Group III nitride semiconductor layer and the p-type Group III nitride semiconductor laminate.

16. The Group III nitride semiconductor device according to claim 1, wherein the Group III nitride semiconductor device comprises an electronic device.

17. A p-type contact structure comprising:
a Group III nitride semiconductor layer having a primary surface, the primary surface including a Group III nitride semiconductor and being inclined with respect to a c-plane of the Group III nitride semiconductor at an angle in a range of 50 degrees or more and 80 degrees or less;
a p-type Group III nitride semiconductor region provided on the primary surface of the Group III nitride semiconductor layer; and
an electrode provided on the p-type Group III nitride semiconductor region,
the p-type Group III nitride semiconductor region including a first p-type Group III nitride semiconductor layer, a second p-type Group III nitride semiconductor layer and a third p-type Group III nitride semiconductor, the first p-type Group III nitride semiconductor layer, the second p-type Group III nitride semiconductor layer, and the third p-type Group III nitride semiconductor layer being arranged in a direction from the electrode to the Group III nitride semiconductor layer along an axis normal to the primary surface, the electrode being in contact with the first p-type Group III nitride semiconductor layer, the first p-type Group III nitride semiconductor layer forming a first heterojunction with the second p-type Group III nitride semiconductor layer, the second p-type Group III nitride semiconductor layer forming a second heterojunction with the third p-type Group III nitride semiconductor layer, and the second p-type Group III nitride semiconductor layer incorporating strain, and wherein the second p-type Group III nitride semiconductor layer has a thickness of not less than 2 nm and a thickness of not more than 10 nm.

18. A p-type contact structure comprising:

a Group III nitride semiconductor layer having a primary surface, the primary surface including a Group III nitride semiconductor and being inclined with respect to a c-plane of the Group III nitride semiconductor at an angle in a range of 50 degrees or more and 80 degrees or less;

a p-type Group III nitride semiconductor region provided on the primary surface of the Group III nitride semiconductor layer; and an electrode provided on the p-type Group III nitride semiconductor region, the p-type Group III nitride semiconductor region including a first p-type Group III nitride semiconductor layer, a second p-type Group III nitride semiconductor layer and a third p-type Group III nitride semiconductor, the first p-type Group III nitride semiconductor layer, the second p-type Group III nitride semiconductor layer, and the third p-type Group III nitride semiconductor layer being arranged in a direction from the electrode to the Group III nitride semiconductor layer along an axis normal to the primary surface, the electrode being in contact with the first p-type Group III nitride semiconductor layer, the first p-type Group III nitride semiconductor layer forming a first heterojunction with the second p-type Group III nitride semiconductor layer, the second p-type Group III nitride semiconductor layer forming a second heterojunction with the third p-type Group III nitride semiconductor layer, and the second p-type Group III nitride semiconductor layer incorporating strain, wherein the second p-type Group III nitride semiconductor layer has an acceptor concentration in a range of −20 percent to +20 percent of an acceptor concentration of the first p-type Group III nitride semiconductor layer, and the third p-type Group III nitride semiconductor layer has an acceptor concentration lower than acceptor concentrations of the first and second p-type Group III nitride semiconductor layers.

* * * * *